(12) United States Patent
Takahashi et al.

(10) Patent No.: US 7,864,296 B2
(45) Date of Patent: Jan. 4, 2011

(54) EXPOSURE APPARATUS, SETTING METHOD, AND EXPOSURE METHOD HAVING THE SAME

(75) Inventors: Kazuhiro Takahashi, Utsunomiya (JP); Koji Mikami, Nikko (JP); Michio Kono, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 335 days.

(21) Appl. No.: 11/459,117

(22) Filed: Jul. 21, 2006

(65) Prior Publication Data

US 2007/0046921 A1   Mar. 1, 2007

(30) Foreign Application Priority Data

Jul. 22, 2005  (JP) ............... 2005-212254

(51) Int. Cl.
*G03B 27/54*  (2006.01)
*G03B 27/72*  (2006.01)
(52) U.S. Cl. .......................... 355/71; 355/67
(58) Field of Classification Search .......... 355/71
See application file for complete search history.

(56) References Cited

U.S. PATENT DOCUMENTS

| | | | | |
|---|---|---|---|---|
| 5,677,757 A * | 10/1997 | Taniguchi et al. | ............. | 355/71 |
| 5,680,588 A | 10/1997 | Gortych et al. | | |
| 2002/0062206 A1 | 5/2002 | Liebchen | | |
| 2003/0090643 A1* | 5/2003 | Sato | ............. | 355/69 |
| 2003/0148198 A1* | 8/2003 | Lakkapragada et al. | ........ | 430/30 |
| 2004/0119954 A1* | 6/2004 | Kawashima et al. | .......... | 355/30 |
| 2005/0146704 A1* | 7/2005 | Gruner et al. | ................ | 355/71 |
| 2006/0001846 A1* | 1/2006 | Kono et al. | .................... | 355/18 |
| 2006/0055834 A1 | 3/2006 | Tanitsu et al. | | |
| 2006/0139611 A1* | 6/2006 | Wagner et al. | ................ | 355/71 |
| 2006/0192149 A1* | 8/2006 | Van Dam et al. | ....... | 250/492.22 |

2008/0074632 A1   3/2008   Tanitsu et al.

(Continued)

FOREIGN PATENT DOCUMENTS

JP   6-120119   4/1994

(Continued)

OTHER PUBLICATIONS

Ebihara, Takeaki, et al. "Characterization of Imaging Performance: Considering Both Illumination Intensity Profile and Lens Aberration," Proceedings of the SPIE—The International Society for Optical Engineering SPIE-INT., Soc. Opt. Eng. USA, vol. 5754, No. 1, 2004. pp. 1693-1703.*

(Continued)

*Primary Examiner*—Georgia Y Epps
*Assistant Examiner*—Ryan Howard
(74) *Attorney, Agent, or Firm*—Rossi, Kimms & McDowell LLP

(57) ABSTRACT

An exposure apparatus for exposing a pattern of a reticle onto a plate using a light from a light source and an optical system includes a measuring part for obtaining polarization information of the light that has passed the optical system, the polarization information including at least one of polarized light intensities, a ratio between the polarized light intensities, a degree of polarization, and a retardation of two orthogonal directions that are both parallel to the optical axis, and a controller for controlling, based on a measurement result by the measuring part, at least one exposure parameter of the light source and the optical system.

13 Claims, 18 Drawing Sheets

U.S. PATENT DOCUMENTS

2008/0239274 A1  10/2008  Tanitsu et al.

FOREIGN PATENT DOCUMENTS

| JP | 8-335552 | 12/1996 |
|---|---|---|
| JP | 2002-184688 | 6/2002 |
| JP | 2002-319539 | 10/2002 |
| JP | 2002-324752 | 11/2002 |
| WO | 2004/051717 A1 | 6/2004 |

OTHER PUBLICATIONS

Office Action issued in corresponding Chinese Patent Application No. 200610105988.3 dated Jul. 3, 2009.

* cited by examiner

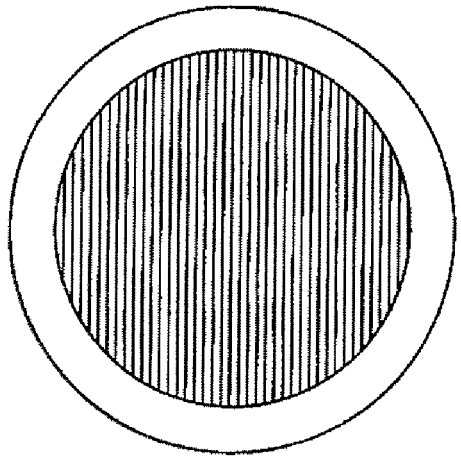
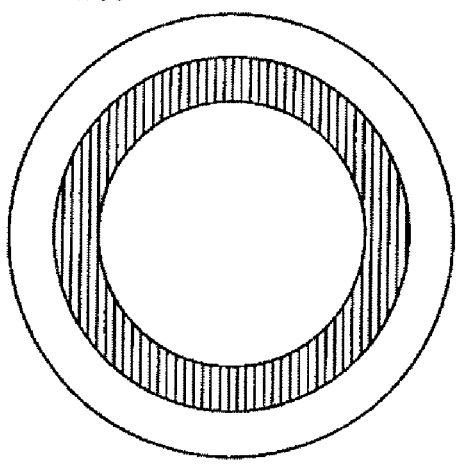
FIG. 3A  FIG. 3B
 
FIG. 3C  FIG. 3D

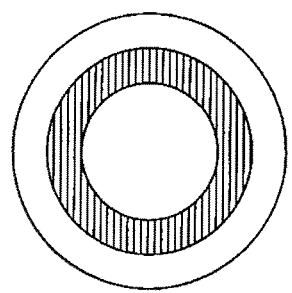
FIG. 5A
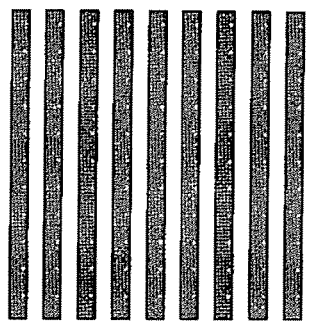
FIG. 5B
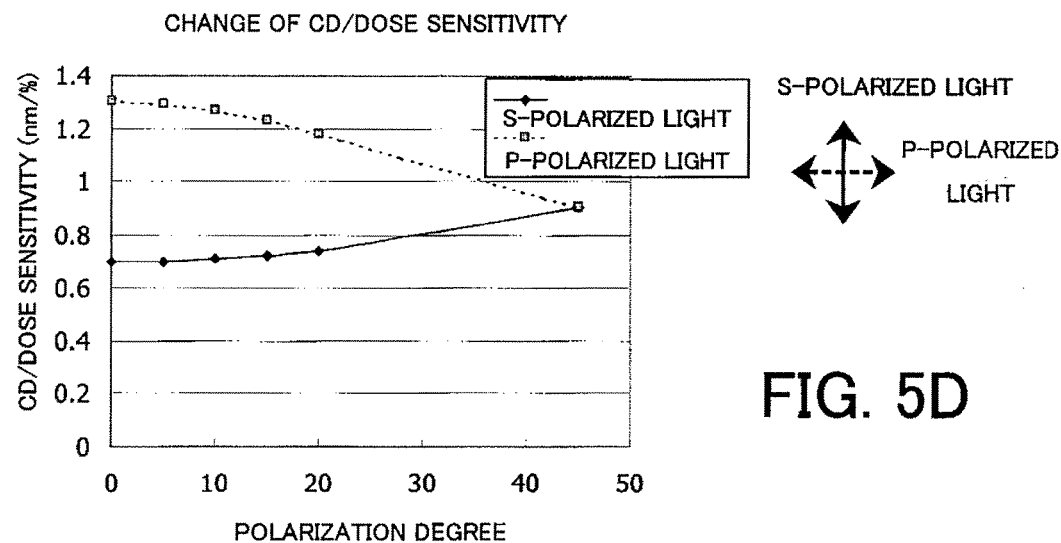
FIG. 5C
FIG. 5D

BIREFRINGENCE AMOUNT

EXPOSURE APPARATUS, SETTING METHOD, AND EXPOSURE METHOD HAVING THE SAME

BACKGROUND OF THE INVENTION

The present invention relates generally to an exposure apparatus and method, and more particularly to optimizations of both an exposure condition and a reticle (or mask) pattern for an exposure apparatus. The present invention is suitable, for example, for optimizations of both the exposure condition and reticle pattern for an exposure apparatus that includes a projection optical system having a numerical aperture ("NA") of 0.8 or greater.

A projection exposure apparatus already uses a projection optical system to expose a reticle pattern onto a wafer etc., and is increasingly required for a high resolution. A high NA of the projection optical system is effective to the high resolution, but the optimizations of both the exposure condition and the reticle pattern are also important. A reticle pattern is optimized, for example, through an optical proximity correction ("OPC"). It seems efficient to use an imaging simulation or simulator for optimization instead of exposure process. See, for example, Japanese Patent Applications, Publication Nos. 2002-319539, 2002-324752, 06-120119, 08-335552 and 2002-184688.

As the high NA scheme advances for a high resolution, the polarization's influence on an imaging characteristic increases. In particular, an imaging patterns can not print in some case depending upon a light's polarization direction in the recently proposed immersion exposure. See, for example, Proceedings of SPIE, Vol. 5377 (2004), p. 68.

The conventional optimizations of the exposure condition and the reticle pattern cannot secure a expected printing characteristic with a high NA. As a result of studies of the cause, the instant inventors have discovered that the conventional optimization does not consider a polarization dependency of an optical system, which will be simply referred to as a "polarization property" hereinafter. Information relating to the polarization property will be sometimes referred to as "polarization information."

Due to the glass material's birefringence and birefringence in-pupil distribution, a polarization property of an actual optical system offsets from a originally designed polarization property. This offset influence is non-negligible at a high NA. The characteristic includes, for example, a polarization state of the light that passes the optical system and a pupil transmittance distribution of a projection optical system. The latter depends upon a transmittance difference among optical elements and antireflection coatings applied on their surfaces due to the high NA. The way of correcting any offset from a desired polarization property has not yet been known. As a result, there is a problem that the expected image performance cannot be achieved.

BRIEF SUMMARY OF THE INVENTION

The present invention is directed to an exposure apparatus and method having a high resolution.

An exposure apparatus according to one aspect of the present invention for exposing a pattern of a reticle onto a plate using a light from a light source includes an optical system for introducing the light, a measuring part for obtaining polarization information of the light that has passed the optical system, the polarization information including at least one of polarized light intensities, a ratio between the polarized light intensities, a degree of polarization, and a retardation of two orthogonal directions that are both parallel to the optical axis, and a controller for controlling, based on a measurement result by the measuring part, at least one exposure parameter of the light source and the optical system.

An exposure method according to another aspect of the present invention for exposing a pattern of a reticle onto a plate using a light from a light source and an optical system includes the steps of obtaining polarization information of the light that has passed the optical system, the polarization information including at least one of polarized light intensities, a ratio between the polarized light intensities, a degree of polarization, and a retardation of two orthogonal directions that are both parallel to the optical axis, and setting, based on the polarization information, at least one of exposure parameters of the light source and the optical system or a size or shape of the pattern. A program for enabling a computer to implement the above exposure method is also one aspect of the present invention.

A device manufacturing method according to another aspect of the present invention includes the steps of exposing a plate using the above exposure apparatus, and developing the plate that has been exposed. Claims for a device fabricating method for performing operations similar to that of the above exposure apparatus cover devices as intermediate and final products. Such devices include semiconductor chips like an LSI and VLSI, CCDS, LCDs, magnetic sensors, thin film magnetic heads, and the like.

Other objects and further features of the present invention will become readily apparent from the following description of the preferred embodiments with reference to the accompanying drawings.

BRIEF DESCRIPTION OF THE DRAWINGS

FIG. 3A is a plane view of a circular effective light source in a light attenuation member in the exposure apparatus shown in FIG. 1.

FIG. 3B is a plane view of an annular effective light source in a light attenuation member detected by a photodetector under a reticle in the exposure apparatus shown in FIG. 1.

FIG. 3C schematically shows a degree of polarization of the effective light source shown in FIG. 3A.

FIG. 3D schematically shows a degree of polarization of the effective light source shown in FIG. 3B.

FIG. 5A schematically shows an annular illumination generated by an illumination optical system in the exposure apparatus shown in FIG. 1.

FIG. 5B is a schematic plane view of one illustrative L & S pattern of the reticle in the exposure apparatus shown in FIG. 1.

FIG. 5C is a graph showing a relationship between the degree of polarization and a critical dimension ("CD")/exposure dose sensitivity.

FIG. 5D schematically shows directions of the s-polarized light and the p-polarized light.

DETAILED DESCRIPTION OF THE PREFERRED EMBODIMENTS

Referring now to the accompanying drawings, a description will be given of the preferred embodiments of the present invention.

First Embodiment

Figure 1:
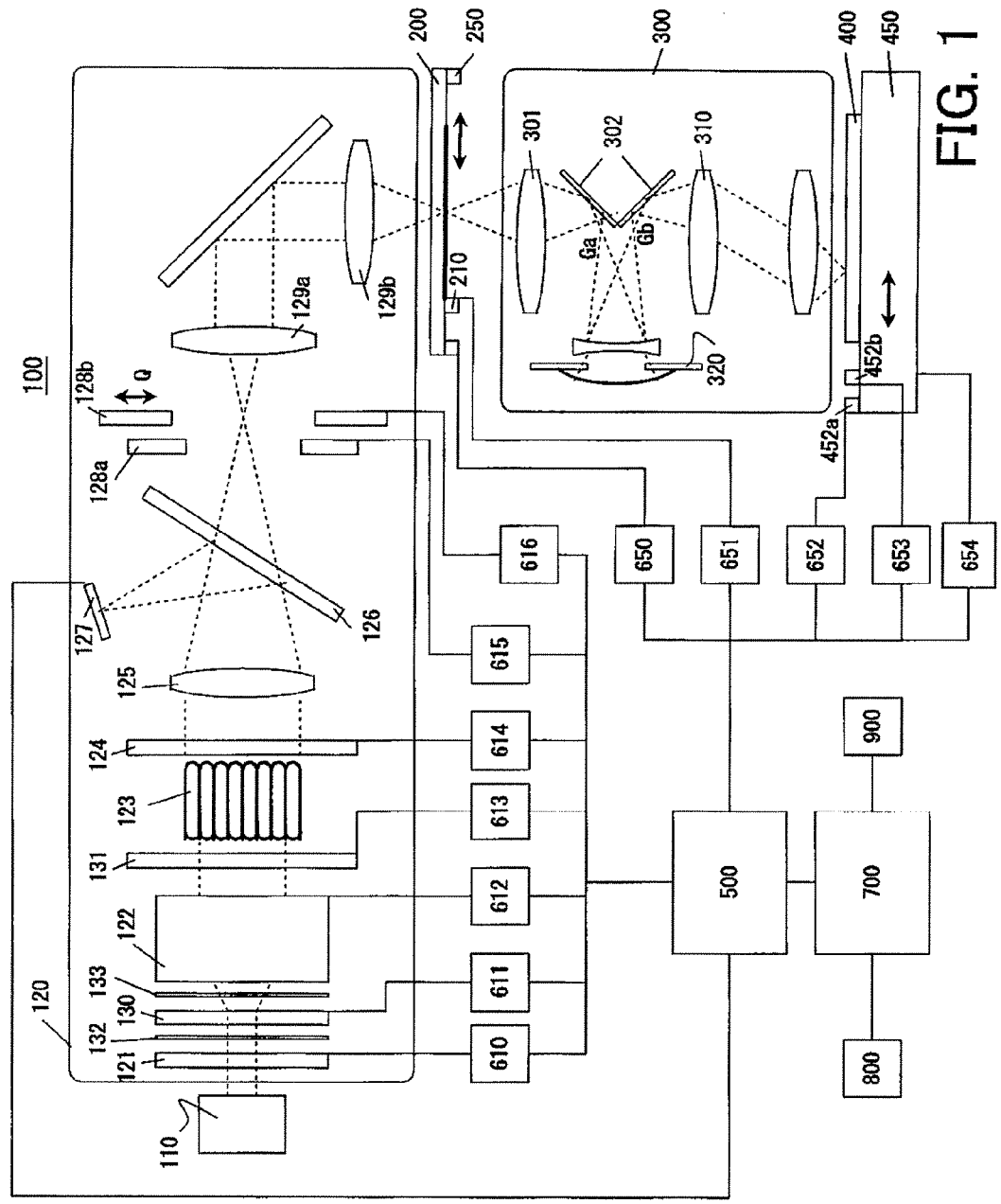
FIG. 1 is a schematic block diagram of an exposure apparatus according to one embodiment of the present invention.

A description will now be given of an exposure apparatus 100 according to one aspect of the present invention. Here, FIG. 1 is a schematic block diagram of the exposure apparatus 100. The exposure apparatus 100 is a projection exposure apparatus that exposes a pattern of a reticle 200 onto a plate 400 in a step-and-scan manner, and is suitable for the lithography process for a resolution below a sub-micron or quarter-micron. The exposure apparatus 100 includes, as shown in FIG. 1, an illumination apparatus, a projection optical system 300, a controller 500, a imaging simulator 700, and memories 800 and 900.

The illumination apparatus illuminates the reticle 200, on which a circuit pattern to be transferred is formed, and includes a light source 110 and an illumination optical system 120.

The light source 110 uses, for example, a laser. The laser can use an ArF excimer laser with a wavelength of approximately 193 [nm], a KrF excimer laser with a wavelength of approximately 248 [nm], and an $F_2$ laser with a wavelength of approximately 157 [nm]. The kind of the laser and the number of lasers are not limited. Similarly, the kind of light source 110 is not limited the laser, and may use one or more mercury and xenon lamp.

The illumination optical system 120 is an optical system that illuminates the reticle 200, and includes various optical elements 121 to 129b. The light attenuating member 121 is made, for example, of plural ND filters or light intensity adjusting filters having different transmittances. A driver 610 moves the plural ND filters so that the optimal exposure dose reaches the plate 400 plane, and these ND filters cooperatively provide a fine adjustment of a light attenuating ratio.

A beam shaping optical system 122 includes plural optical elements and a zoom lens, and is driven by a driver 612. The beam shaping optical system 122 controls the light intensity distribution and angular distribution of the light incident upon the subsequent optical integrator 123 to desired distributions.

A retardation plate 131 defines a polarization direction of the light incident upon the optical integrator 123. A driver 613 drives the retardation plate 131. As described later, 130 denotes a diffraction optical element ("DOE"). 611 denotes a driver that is mounted with the plural DOEs 130. 132 denotes a polarizer. 133 denotes an adjusting mechanism that changes a polarization state of the effective light source on the reticle plane.

The optical integrator 123 has plural, two-dimensionally arranged fine lenses, and forms secondary light sources near its exit plane. The stop 124 is located near the exit plane of the optical integrator 123, and has a variable size and shape. A driver 614 drives a turret that has plural stops 124 to adjust a size and shape of the stop 124.

The condenser lens 125 condenses the light exited from the plural secondary light sources formed near the exit plane of the optical integrator 123, and irradiates and superimposes them on a field stop 128b, thereby uniformly illuminating the field stop 128b plane conjugate with the plate 400.

The half mirror 126 reflects and introduces part (for example, several %) of the light exited from the optical integrator 123 to the integral exposure dose detector 127. The integral exposure dose detector 127 is a light intensity detector that always detects the light intensity during exposure near a position optically conjugate with the reticle 200 and the plate 400, and transmits a signal corresponding to the output to the controller 500.

The field stop 128b includes plural movable light shielding plates, and is driven by a driver 616 to form an arbitrary opening shape. The field stop 128b is arranged at a position conjugate with the plate 400, and moves in an arrow Q direction in FIG. 1 in synchronization with the reticle stage 250 and the plate stage 450. The variable stop 128a that improves the light intensity uniformity on the scan-exposed plane is located near the field stop 128b.

Figure 2:
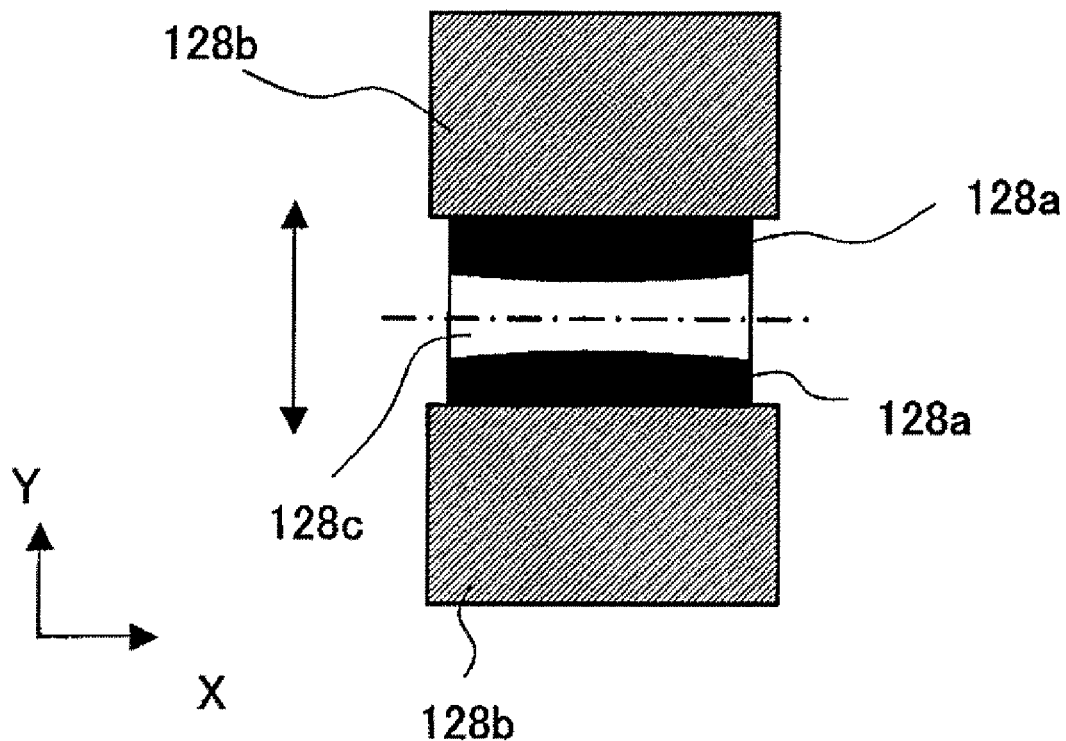
FIG. 2 is a plane view of a stop (or a masking blade) on a plane perpendicular to an optical axis in the exposure apparatus shown in FIG. 1.

The variable stop 128a is arranged near the position conjugate with the plate 400 but closer to the light source 110 than the conjugate position or upstream the optical path. The variable stop 128a has such a shape as shown in FIG. 2 that an opening 128c that forms an exposure area (or an illumination area) along an X direction orthogonal to a scanning direction Y gradually extends with a distance from the optical axis within a plane orthogonal to the optical axis of the illumination light. A longitudinal side shape can be adjusted like an n-th order function, where n is an integral between 1 and 8. The variable stop 128a has a shape and position of the opening 128c that is configured variable by the driver 615 along the optical axis direction. A positional adjustment is executed while the variable stop 128a remains closer to the light source than the position conjugate with the plate 400.

A pair of imaging lenses 129a and 129b project an opening shape of the field stop 128b onto the reticle plane, and uniformly illuminate a necessary area on the reticle plane.

The reticle 200 is made, for example, of quartz, and has a circuit pattern to be transferred. The reticle 200 is supported by a reticle stage 250, and driven by a driver 650. The diffracted light from the reticle 200 passes through the projection optical system 300 and is then projected onto the plate 400. The reticle 200 and the plate 400 are located in an optically conjugate relationship. Since the exposure apparatus 100 is a scanner, the reticle 200 and the plate 400 are synchronously scanned, thus transferring the reticle pattern onto the plate 400. If it is a step-and-repeat exposure apparatus (referred to as a "stepper"), the reticle 200 and the plate 400 remain still in exposing the reticle pattern.

The two-dimensional photo sensor 210 is located slightly under the reticle 200. When the reticle plane has a pinhole, the photodetector 210 measures the light intensity distribution on a Fourier transformation plane of the plate 400, of the light that has passed the illumination optical system 120. When a polarizing filter is provided above the photodetector 210, the light intensity distribution can be measured for each polarization direction. A driver 651 controls the photodetector 210.

The projection optical system 300 projects the diffracted light from the illuminated reticle pattern onto the plate 400 as a substrate. The projection optical system 300 of this embodiment is a catadioptric system that includes plural lenses 301 and plural mirrors 302, but may be a dioptric or catoptric system. In FIG. 1, the reticle pattern is reduced onto the plate 400 plane after imaged once or more at intermediate imaging positions Ga and Gb. The projection optical system 300 includes a lens group 310 and a NA stop 320. The lens group 310 can control plural aberrations and distortion components in accordance with the apparatus state and the reticle. The NA stop 320 is fine-adjustable in accordance with the pattern's CD.

The plate 400 is a substrate to be exposed, such as a wafer and a liquid crystal substrate. A photoresist is applied to a surface of the plate 400. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a primary coat (i.e., a process to increase the hydrophobicity by applying a surface active agent), through coating or evaporating an organic film such as HMDS (Hexamethyl-disilazane). The pre-bake treatment is a baking (or burning) step, softer than that after development, which removes the solvent.

The plate stage 450 supports the plate 400, and can use a known structure. For example, the plate stage 450 moves the plate 400 along the optical axis and on the plane perpendicular to the optical axis. A driver 652 drives and controls the plate stage 450. The plate stage 450 is provided on a stage stool (not shown) supported, for example, on the floor via a damper. The reticle stage 250 and the projection optical system 300 are provided, for example, on a barrel stool (not shown) supported on a base frame via a damper, which is placed on a floor etc.

The reticle 200 and the plate 400 are synchronously scanned. The positions of the plate stage 450 and reticle stage 250 are monitored, for example, by a laser interferometer, and they are driven at a constant speed ratio. When the reduction ratio of the projection optical system 300 is 1/A and the plate stage 450 has a scanning speed of B (mm/sec), the reticle stage 250 has a scanning speed of AB (mm/sec). The scanning direction of the reticle stage 250 and that of the plate stage 450 may be parallel or antiparallel depending upon the focal point of the imaging lens of the projection optical system and the number of mirrors.

A photodetector 452a detects the light intensity of the illumination light incident upon the plate plane. The photodetector 452a is provided near the plate 400, and its light-receiving part is located at a position approximately corresponding to the plate plane. The photodetector 452a moves with the plate stage 450, receives the illumination light in the illumination area of the plate 400, and sends a signal corresponding to the detected light intensity to the controller 500.

A two-dimensional photo sensor 452b detects a two-dimensional luminosity distribution of the light that has passed the projection optical system 300. The photodetector 452b is located slightly under the plate plane. The plate plane has a pinhole, and the photodetector 452b detects a transmission light, and detects the light intensity distribution on the exit pupil plane of the projection optical system 300. A polarizing filter (not shown) is located above the photodetector 452b to measure the light intensity distribution for each polarization direction. The polarization information includes, as described later, at least one of polarized light intensity, a polarized light intensity ratio, a degree of polarization, and a retardation in two orthogonal directions that are perpendicular to the optical axis.

A $\lambda/4$ plate (not shown) may be inserted before the polarizing filter near the reticle plane or near the plate plane. A measurement of the amplitude distribution on the entire pupil plane through a rotation of the $\lambda/4$ plate provides the polarization information on the entire pupil plane.

Figure 14:
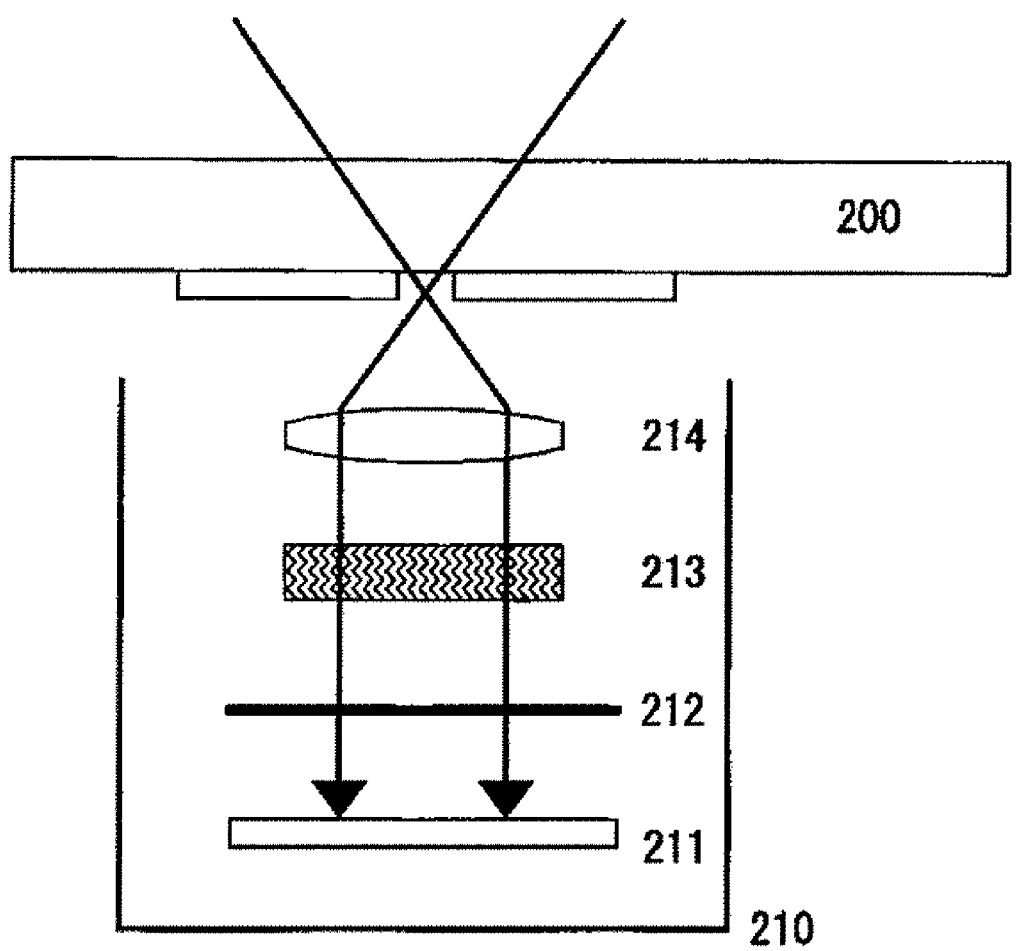
FIG. 14 is an enlarged sectional view of a detector near the reticle plane shown in FIG. 1.

FIG. 14 is an enlarged sectional view of a detector near the reticle plane. A pinhole P is provided in the reticle 200, and a collimator 214 approximately collimates the condensed light. A two-dimensional photo sensor 211 measures the light intensity distribution of the collimated light through a polarizing filter 212. A $\lambda/4$ plate 213 is inserted before the polarizing filter 212, and rotated in measuring the amplitude distribution of the entire pupil plane of the light and obtaining the polarization information of the entire pupil plane. The photodetector (or polarization measuring mechanism) 452*b* near the plate plane has a similar mechanism. The polarization information will now be expressed with the following Stokes parameters, where (u, v) denotes a normalized coordinate of the effective light source.

$$S_1(u,v) = S_0(u,v)\cos 2\chi \cos 2\Phi$$

$$S_2(u,v) = S_0(u,v)\cos 2\chi \sin 2\Phi$$

$$S_3(u,v) = S_0(u,v)\sin 2\chi$$

$$S_0^2 = S_1^2 + S_2^2 \circ S_3^2 \quad \text{[EQUATION 1]}$$

A sign of $\chi$ differentiates a clockwise polarization and a counterclockwise polarization from each other. $\Phi$ expresses an amplitude of polarization components of 0°, 90°, [$S_1$(u, v)], 45°, 135°, [$S_2$(u, v)] on a section along the optical axis.

The polarization information may be expressed with the following Jones vector:

$$\begin{pmatrix} J_1(u,v)e^{i\varphi_1(u,v)} \\ J_2(u,v)e^{i\varphi_2(u,v)} \end{pmatrix} \quad \text{[EQUATION 2]}$$

Equation 2 indicates the light intensity and its phase on the orthogonal polarization planes. A polarization intensity ratio $\{|J_2(u,v)|/|J_1(u,v)|\}$ and a retardation $\{\Phi_1(u,v) - \Phi_2(u,v)\}$ on the orthogonal plane are easily available from Equation 2.

The polarization information can be expressed more simply. The photodetector 210 can obtain distributions of amplitudes $I_p$ and $I_s$ on the entire pupil plane, where the amplitude $I_p$ is an amplitude of a perpendicularly polarized light to the paper plane and incident upon the reticle 200, and the amplitude $I_s$ is an amplitude of a horizontally or laterally polarized light to the paper plane and incident upon the reticle 200. The degree of polarization can be calculated for the entire pupil plane, where ROP denotes a degree of polarization as a ratio of the intensity of the light polarized in a predetermined direction to the entire intensity:

$$ROP(u,v) = \frac{|J_1(u,v)|^2}{|J_1(u,v)|^2 + |J_2(u,v)|^2} \quad \text{[EQUATION 3]}$$

Understandably, $1/ROP = 1 + \{\{|J_2(u,v)|/|J_1(u,v)|\}^2$ relates to the polarized light intensity ratio. Similarly, the ROP can be expressed with the light intensity $I_s$ in a predetermined polarization direction and the light intensity $I_p$ in a direction perpendicular to the predetermined polarization direction as follows:

$$ROP(u,v) = \frac{Is(u,v)}{(Ip(u,v) + Is(u,v))} \quad \text{[EQUATION 4]}$$

While this embodiment discusses an illustrative acquisition on the plate 400 plane, of the polarization information of the exit pupil plane of the projection optical system 300. The polarization information on the reticle plane can be obtained by reflecting the light on the plate plane once or by illuminating from the plate plane.

The controller 500 obtains the detection results of the integral exposure dose detector 127, and the photodetectors 452*a* and 452*b* via converters 652 and 653. The controller 500 drives the drivers 610-616, 650, and 654 based on these detection results, and controls the exposure dose on the plate 400 plane or the light intensity distribution. The imaging simulator 700 optimizes an exposure condition. The memory 800 stores pattern (or design) data of the reticle 200 including OPC data. The memory 900 stores an evaluation result of an actually exposed plate 400. The controller 500 thus acquires the pattern data of the reticle 200 and the evaluation data of the actually exposed plate 400.

Figure 4A:
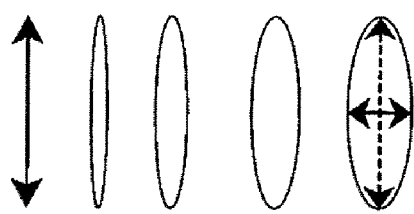
FIG. 4A schematically shows a transition from a linearly polarization to an elliptical polarization.
Figure 4B:
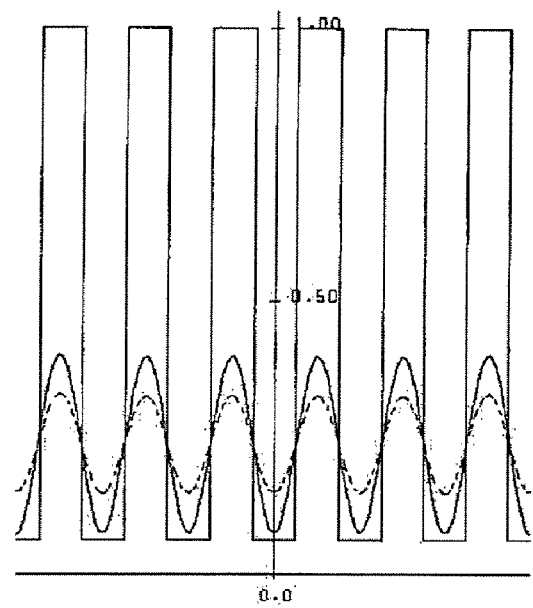
FIG. 4B schematically shows imaging contrasts of a line and space ("L & S") pattern illuminated by a p-polarized light (broken line) and an s-polarized light (solid line).

Referring now to FIGS. 3 to 5, a description will be given of the influence of the polarization information on the imaging characteristic. FIGS. 3A and 3B show that the illumination optical system 120 turns an illumination light (FIG. 3A) having an approximately circular light intensity distribution just after the light source 110 (or at a position of the light attenuation member 121) into an illumination light (FIG. 3B) having an annular effective light source shape (at a position of the photodetector 210) However, the degree of polarization degrades from the linearly polarization (FIG. 3C) to the elliptical polarization (FIG. 3D) due to those such as the glass material's birefringence in the illumination optical system 120. FIG. 4A schematically shows that the linearly polarization (left) turns into the elliptical polarization (right). FIG. 4B schematically shows the contrasts when the L & S pattern is illuminated by the p-polarized light (broken line) and s-polarized light (solid line). FIG. 5A schematically shows an annular illumination. FIG. 5B is a plane view of an illustrative L & S pattern. FIG. 5C is a graph showing a relationship between the degree of polarization and the CD/exposure dose sensitivity. FIG. 5D schematically shows directions of the s-polarized light and the p-polarized light.

Assume that a reticle 200 that has an A×B nm L & S pattern is annularly illuminated with a projection optical system 300 that has an NA of 1.2 and a reduction ratio of 1/A times, as shown in FIG. 5A. With an ideal annular illumination of the linearly polarizations, the light intensity distribution differs between the polarization direction of the s-polarized light direction and the polarization direction of the p-polarized light direction as shown in FIG. 4B. FIG. 5C shows the CD sensitivity of the central pattern relative to the exposure dose when the degree of polarization varies. From FIG. 5C, when the direction of the L & S pattern accords with the polarization direction, the sensitivity reduces and the CD becomes robust relative to the exposure dose. As the polarization direction rotates, the sensitivity increases and the robustness loses. Conversely, in the polarization direction perpendicular to the pattern, the sensitivity becomes high and the robustness becomes lowest, but as the polarization direction rotates the robustness becomes higher.

A pair of the polarization direction and the pattern direction thus determines the image quality. For the stable imaging characteristic, the reticle 200 and the rotation of the polarization direction of the illumination light should be controlled. The exposure apparatus 100 marks the polarizer 132 or its holder so as to control the polarization direction. On the other hand, the positioning accuracy of reticle writer and the reticle alignment system of the exposure apparatus 100 precisely control the rotational angle of the reticle pattern.

The degree of polarization, which is a simple expression as one dimensional polarization information, is taken up as an example to explain the influence on the resolving power. The imaging characteristic degrades when the linearly polarization that is parallel to the paper plane change to the elliptical polarization, as shown in FIG. 4A. For example, the lens's birefringence deteriorates the degree of polarization. The birefringence of the lens downstream the polarizer 132 must be maintained low, e.g., at 2 nm/cm or smaller. Nevertheless, even the glass material having a small birefringence would degrade the degree of polarization due to the residue intrinsic birefringence, the stress birefringence caused by lens holding, and the characteristic of the film formation and so on. For these reasons, a different exposure apparatus has a different degree of polarization and a different characteristic.

One correction method of the degraded degree of polarization uses an average integral exposure dose to adjust the average CD changing amount for each shot exposure. More specifically, the method makes the number of laser pulses and each pulse energy variable, and controls the integral energy as the integral value.

Another correction method of the degraded degree of polarization uses an adjusting mechanism 133 that changes the polarization state of the effective light source onto the reticle plane. For example, based on the degree of polarization measured by the photodetector 210, the adjusting mechanism 133 moves and cancels a difference of a reference degree of polarization among exposure apparatuses, where the reference degree of polarization of the exposure apparatus 100 denotes the average degree of polarization in the effective light source at the slit center point. The reference degree of polarization may be an average value in the arbitrary region in the pupil, or an average of several points including not only the slit center point but also the off-axis points. A concrete method for adjusting the difference of the reference degree of polarization among exposure apparatuses may be, for example, to switch some stages of polarizers 132 having different polarization properties, to generate the stress birefringence by providing a stress to part of the lens, to incline a plane-parallel plate glass at a position where the light is not divergent or condensed, or to rotate the polarizer 132 and the λ/4 phase plate, or to use a combination of some or all of the above approaches.

The imaging contrast varies due to the chromatic aberration of the projection optical system 300 when an optical characteristic other than the polarization, e.g., the spectral bandwidth of the light source is changed. The imaging contrast varies due to other parameters, such as a σ shape of the effective light source, changes of values of the inner c and the outer a, the NA of the projection optical system 300, and a pupil filter. The polarization's influence on the contrast is correctable using these parameters.

The spectral bandwidth has an index of the full width half maximum ("FWHM") or a spectrum width (E95) in which 95% of energy concentrates in the spectrum. One spectrum changing method can use, for example, a mechanism that makes the spectrum distribution variable, such as a mechanism that changes the laser's FWHM, or place a wavelength selective filter after the light source.

Figure 8A:
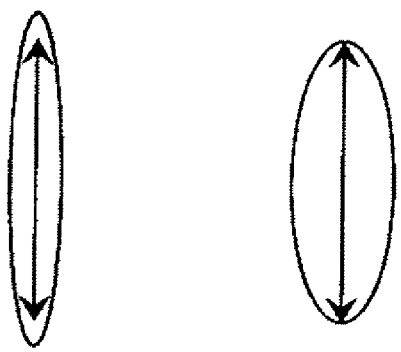
FIG. 8A is a plane view of an illustrative reticle pattern shown in FIG. 1.
Figure 8B:
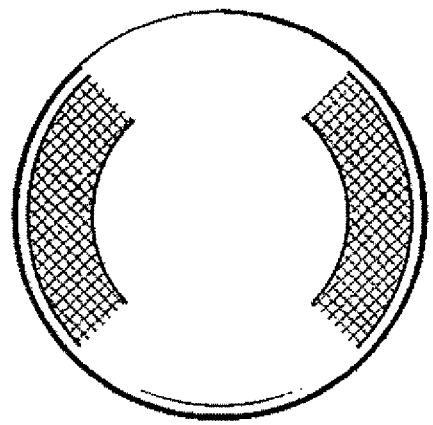
FIG. 8B is an illustrative dipole effective light source shape for the reticle pattern shown in FIG. 8A.
Figure 8C:
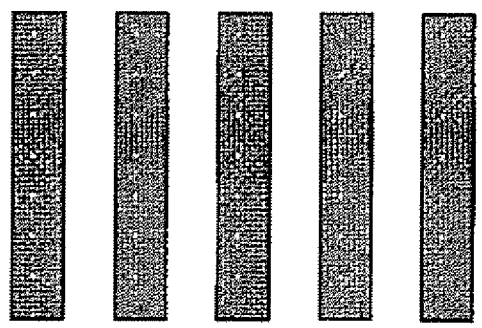
FIG. 8C is a schematic view of the degree of polarization in the dipole illumination shown in FIG. 8B.
Figures 8D, 8E:
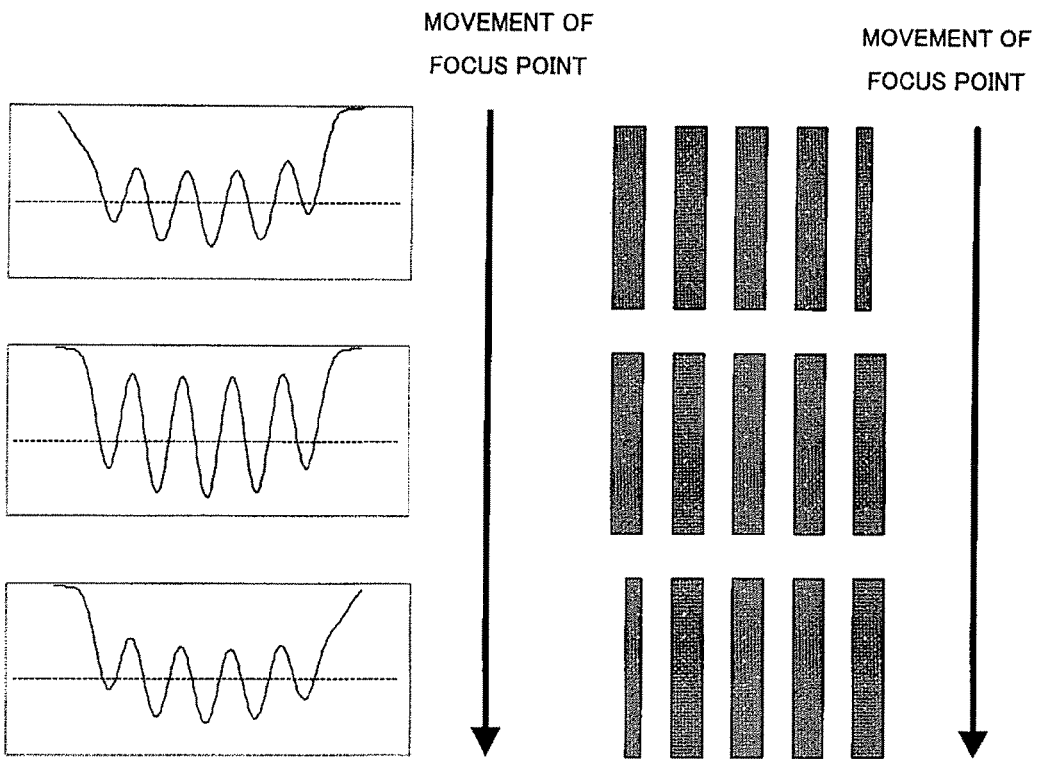
FIG. 8D shows an aerial image on a plate for each focus position when the reticle pattern shown in FIG. 8A is illuminated by the effective light sources shown in FIGS. 8B and 8C.
FIG. 8E shows a resist image for each focus position when the reticle pattern shown in FIG. 8A is illuminated by the effective light sources shown in FIGS. 8B and 8C.

Referring now to FIGS. 8A to 8C, a description will be given of the asymmetry of the degree of polarization within the pupil plane. Here, FIG. 8A schematically shows the degree of polarization in the dipole illumination. FIG. 8B is a plane view of the dipole effective light source for illuminating the reticle pattern. FIG. 8C is a plane view of one illustrative reticle pattern. FIG. 8D shows an aerial image on the plate plane for each focus position. FIG. 8E shows a resist images for each focus position.

Assume the pattern shown in FIG. 8C on the reticle 200 is illuminated by the effective light source shown in FIG. 8B that has an asymmetric average degree of polarization corresponding to a point light source between the left and right areas as shown in FIG. 8A. In FIG. 8A, the imaging influence of the left area in the effective light source is stronger since the left area in the effective light source has a better linearity in the degree of polarization and the light intensity has no difference. Thereby, the aerial image on the plate plane becomes as shown in FIG. 8D by the focal plane. When the imaging point of the plate 400 is longitudinally shifted parallel to the paper plane, the resist image has a reversed polarity at the boundary of the best focus position, as shown in FIG. 8E, with respect to the lateral CD difference between the right end and the left end in the L & S pattern, i.e., (the left CD)–(the right CD). Although the above pattern orients in a predetermined direction, a pattern perpendicular to this pattern exhibits a similar degree of polarization difference between the top and bottom effective light sources of the paper plane.

Figure 8F:
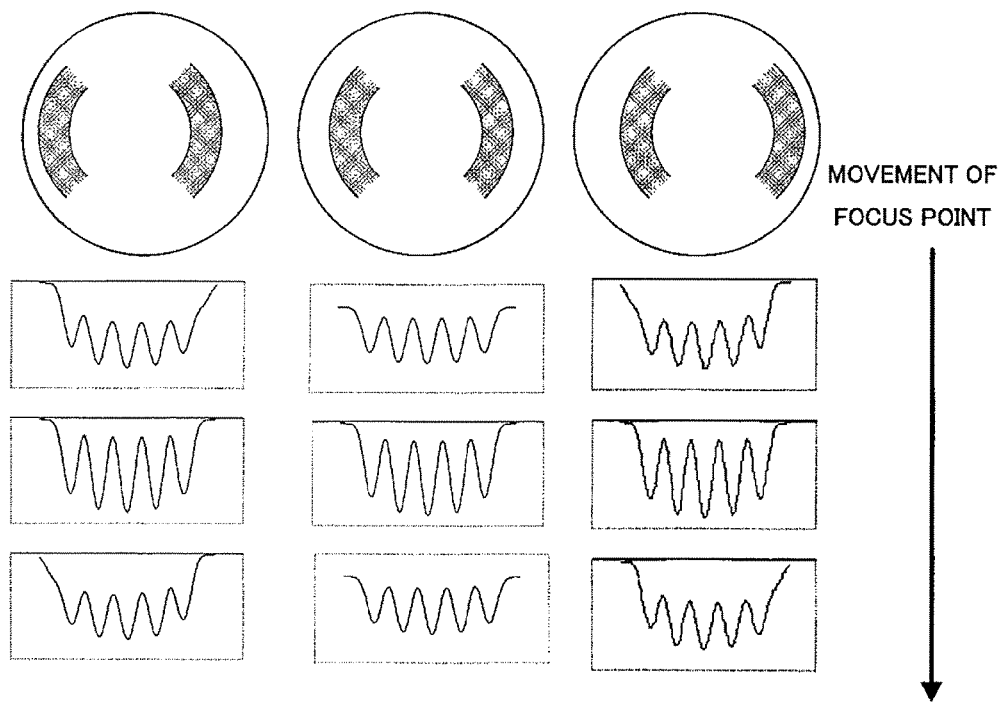
FIG. 8F shows aerial images on the plate for the principal ray of the light for illuminating the reticle shown in FIG. 1 which is parallel to the optical axis, and for the principal rays of the lights that laterally inclines.
Figure 8G:
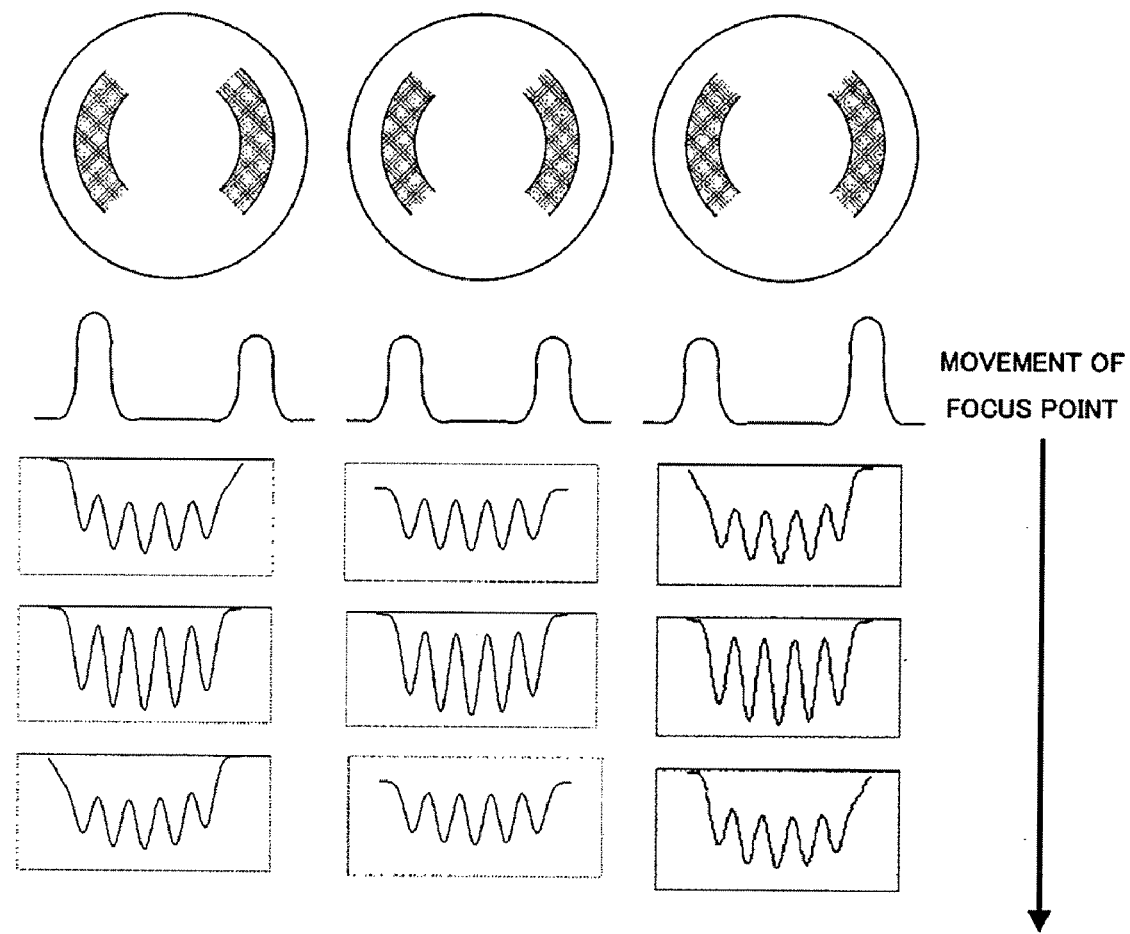
FIG. 8G shows aerial images on the plate when the light for illuminating the reticle shown in FIG. 1 is in a telecentric state and the effective light source intensity has the same in the lateral direction, and when the light for illuminating the reticle shown in FIG. 1 is in the telecentric state and the effective light source intensity differs in the lateral direction.

FIG. 8F shows aerial images on the image plane when the principal ray of the illuminating system is incident parallel to the optical axis (telecentricity) and the light intensity of the effective light source is lateral shifted. FIG. 8G shows aerial images on the plate plane when the principal ray of the illumination light inclines laterally and the light intensity of the effective light source is laterally the same. In either example, as the imaging point of the plate 400 moves in the longitudinal direction parallel to the paper plane, the asymmetrical direction of the image changes, and the polarity of the lateral CD difference of the L & S pattern inverts at the boundary of the best focus position. Therefore, the pattern's asymmetry on the resist pattern is adjustable, which is caused by the asymmetry of the degree of polarization on the pupil plane, by using the telecentricity of the illumination optical system 120 and the light intensity distribution of the effective light source. A method for wholly adjusting the telecentricity on the entire screen may be, for example, to move or incline the optical element group of the beam shaping optical system 122 in a direction perpendicular to the optical axis.

A description will now be given of another polarization's influence on the pattern. The effective light source is segmented into four symmetrical areas around the central angle of 0°, 90°, 180° and 270°. An average value between a pair of opposite areas with respect to the X direction and an average value between a pair of opposite areas with respect to the Y direction may differ in degree of polarization like a Saddle shape. If the Saddle-shaped degree of polarization is not uniform among plural exposure apparatuses, a pattern CD difference occurs between the X direction and the Y direction.

On the other hand, if the amplitude distribution of the effective light source has a difference between the average light intensity in the X direction and that in the Y direction among these four symmetrical areas, a CD difference occurs, similar to the influence of the polarization, between the X direction pattern and the Y direction pattern. Therefore, the degree of polarization difference among exposure apparatuses can be corrected by making an amplitude distribution difference of the effective light source of the exposure apparatus between the X direction area and the Y direction area.

A method for making a light intensity difference between the X and Y directions can use a mechanism that inserts an ND filter near the integrator 123, and changes its concentration. The method can use a mechanism that independently inserts and removes light shielding plates in the lateral and longitudinal directions near the pupil plane of the illumination optical system 120, and adjusts the concentration.

The above description relating to the correction method of the asymmetrical component (1θ component) of the degree of polarization in the effective light source of the illumination optical system 120 and Saddle component (2θ component) can be expanded to arbitrary scattering of the degree of polarization ROP(u, v) having arbitrary scattering in the pupil plane. A method of expressing the degree of polarization can use the Zernike series relating to the pupil plane in the effective light source so as to classify the degree of polarization into respective components.

Arbitrary control of the luminosity distribution of the effective light source can correct the arbitrary scattering of the degree of polarization in the pupil plane. The DOE 130, for example, can arbitrarily form a pupil plane shape or a luminosity distribution of the illumination optical system 120.

A method for changing the luminosity distribution of the effective light source other than use of the DOE can utilize an optical prism and a concentration filter or provide a light shielding plate near the Fourier transformation plane of the reticle 200 for corrections. In particular, an effective mechanism to correct a characteristic difference of the imaging pattern between the horizontal and perpendicular directions is to change an ND filter in the horizontal and perpendicular directions of the effective light source or to independently insert and remove the light shielding plates in the longitudinal and lateral directions.

As discussed above, another exposure parameter in the exposure apparatus 100 can correct the polarization's influence that occurs on average on the pupil plane for each point on the slit, thereby providing a high pattern transfer characteristic at an improved yield. The degree of polarization may be measured on the stage.

Second Embodiment

Figure 9:
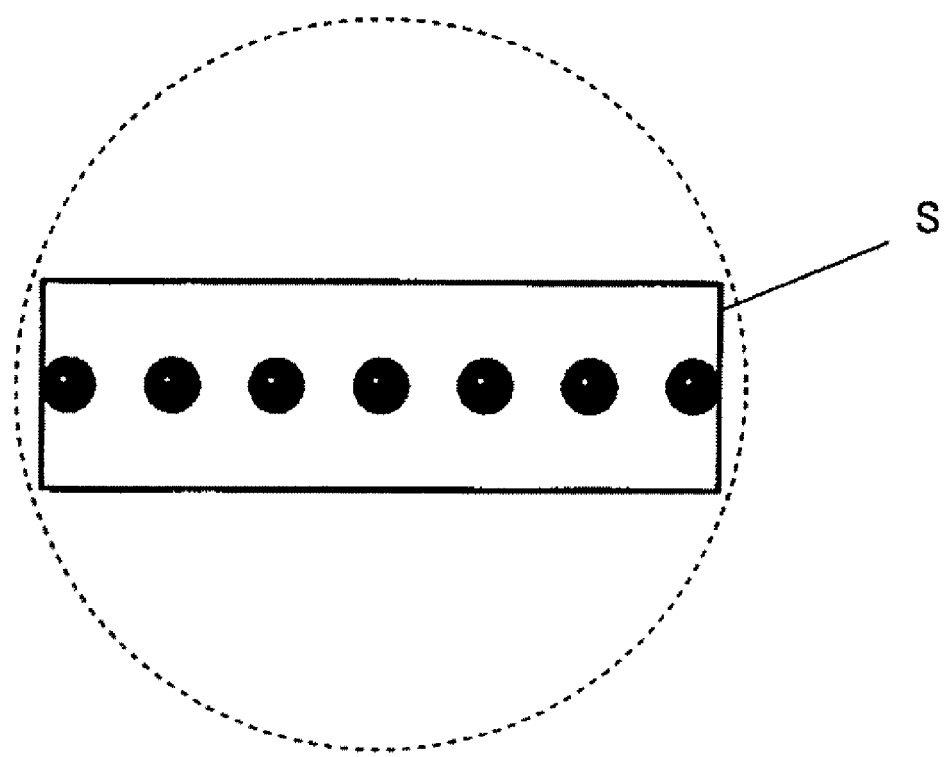
FIG. 9 is a schematic plane view of an exposure slit area on the reticle shown in FIG. 1.

This embodiment will discuss a correction method when a polarization property differs for each image height. The exposure apparatus 100 has the same structure as that of the first embodiment. The polarization information may use the Stokes parameter and Jones vector. But the degree of polarization, which is a simple expression as one dimensional polarization information, is taken up as an example to explain. A solid line in FIG. 9 denotes an exposure slit area S, and a broken line denotes an area from where the ray can pass through the pupil in the projection optical system 300. As shown in FIG. 9, when the photodetector 210 measures the light at plural measuring points that align in the longitudinal direction in the slit S, the degree of polarization to the pupil can be expressed as a two-dimensional map ROPi(u, v) for each image height. The slit longitudinal direction is a perpendicular direction to the paper plane on the reticle in FIG. 1.

While the first embodiment has discussed the correction method of the polarization that is uniformly appeared at all image heights, this embodiment addresses that the actual light's location differs for each image height and the polarization information has a peculiar component for each image height.

Figure 10A:
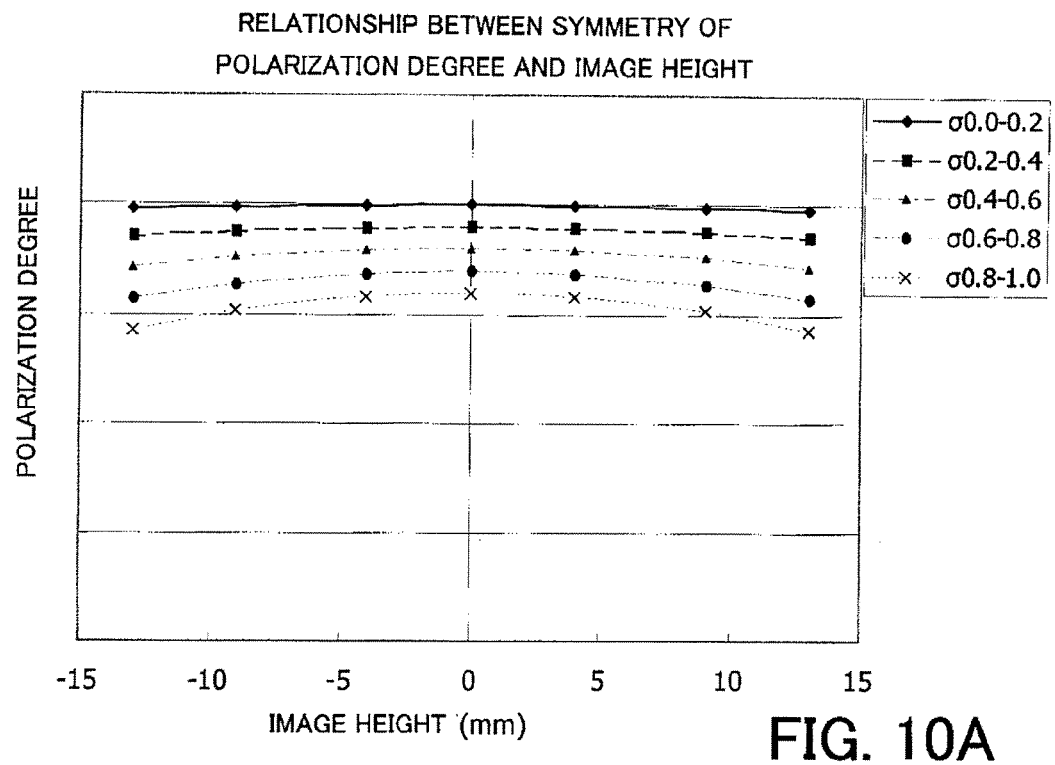
FIG. 10A is a graph showing a relationship between a symmetry of the degree of polarization and an image height.

Although the polarization information for each image height is usually expressed as a two-dimensional map in the pupil plane, FIG. 10A simplifies it and expresses the degree of polarization ROPi (u, v) for each average value of an annulus of σ in the effective light source. A outer annulus compared to inner annulus, contribute effectively to the resolution for a finer pattern. In other words, the annular position has an implication with the pattern. For instance, it is understood that the degree of polarization differs at an in-pupil position of σ0.8-1.0 for each image height. A degree of polarization difference among image heights causes a pattern CD difference in an image projected by the projection optical system 300, and degrades a circuit characteristic.

This embodiment utilizes the influences on the CD of both a change of the degree of polarization and a change of the integral exposure dose, and corrects a CD change that occurs in the change of the degree of polarization by utilizing a change of the integral exposure dose. An uneven-light-intensity adjusting mechanism (stops 128a and 128b) corrects CD scattering that occurs in the scanning direction and a direction orthogonal to the scanning direction of the exposure apparatus 100. Alternatively, a concentration filter may adjust the transmission light intensity.

Figure 10B:
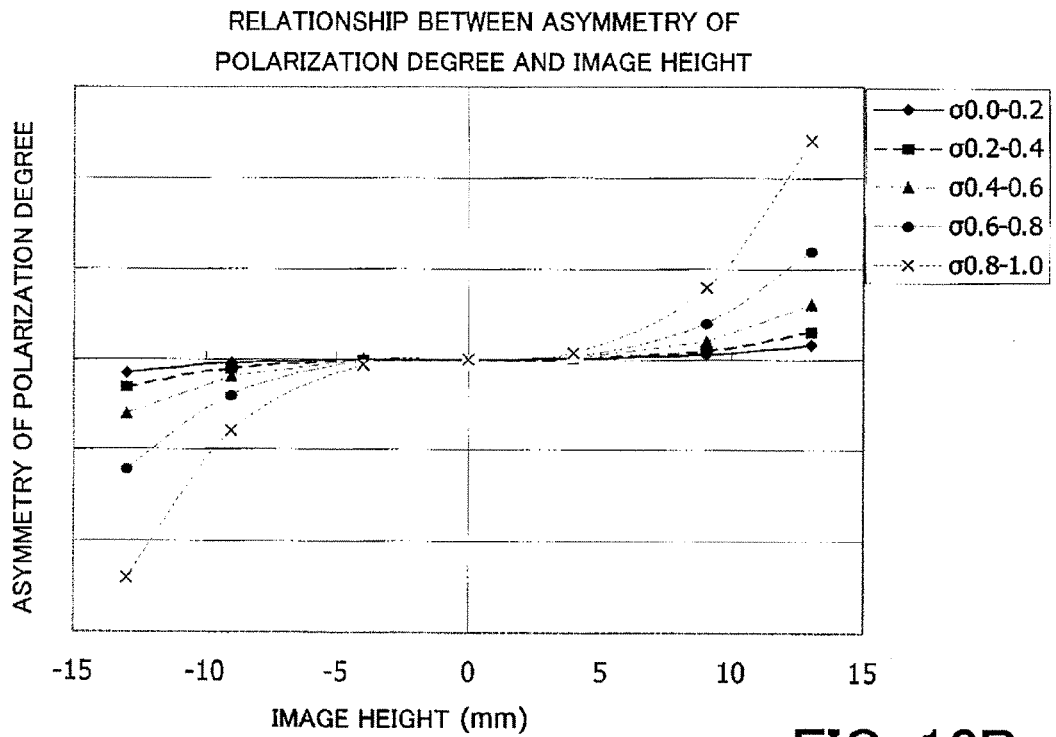
FIG. 10B is a graph showing a relationship showing a relationship between an asymmetry of the degree of polarization and the image height.

The un-uniformity of the degree of polarization in the effective light source for each image height is another non-negligible item influential in imaging. The degree of polarization in the effective light source has an arbitrary distribution for each image height, and will be briefly discussed by utilizing the component classification. First, the effective light source is divided into a annular areas. FIG. 10B divides the effective light source into five areas including $0 \leq \sigma < 0.2$ (i.e., σ0-0.2), $0.2 \leq \sigma < 0.4$ (i.e., σ0.2-0.4), $0.4 \leq \sigma < 0.6$ (i.e., σ0.4-0.6), $0.6 \leq \sigma < 0.8$ (i.e., σ0.6-0.8), $0.8 \leq \sigma < 1.0$ (i.e., σ0.8-1.0). The number of areas is only illustrative.

$P \cdot \sin \theta = \lambda$ is met when the reticle 200 is a binary reticle or a phase shift mask, where P is a pitch of the CD on the reticle 200, θ is an angle between the 1st order diffracted light and the 0th order light, and λ is a wavelength of the illumination light. Therefore, as the CD pitch reduces, sin θ becomes large. When $k1 (= R \cdot \lambda/NA$: R is a resolution) is smaller than 0.5, the diffracted light from the on-axis illumination light deviates from the aperture area of the projection optical system 300, remarkably lowering the imaging contrast. Therefore, only one of ±1st order diffracted lights is selected and combined with the 0th order light for imaging (obliquely incident illumination). Thus, there is a correlation between an obliquely incident angle and the pitch P of the reticle pattern.

The annular area of each a corresponds to an obliquely incident angular range upon the reticle 200, and there is an annular effective light source area that is influential in the certain pitch pattern. The degree of polarization of the annulus effective light source has an arbitrary distribution, which is assumed as follows:

$$P_{even} = \frac{1}{S} \int ROP(u, v) I(u, v) ds \qquad [\text{EQUATION 5}]$$

$$P_{odd} = \frac{1}{S/2} \int_{u>0} \{ROP(u, v) I(u, v) - ROP(-u, v) I(-u, v)\} ds$$

In Equation 5, Peven means the average degree of polarization of the entire of the pupil. Podd is an asymmetry of the degree of polarization in the right and left areas on the pupil. FIG. 10A plots Peven for each image height and annular effective light source. FIG. 10B plots Podd similarly.

When Peven's image height distribution differs for each annular point of the effective light source as shown in FIG. 10A, the target pattern for the CD uniformity for each image height, changes from one reticle to another even if a CD uniformity adjusted in a certain reticle The target a suitable for target patterns accordingly varies, and the CD/light intensity influence for each image height varies accordingly. It is thus necessary to determine a target pattern for each reticle, and adjust the uneven light intensity amount. When the average degree of polarization distribution has a certain characteristic for each image height, a correction amount, such as an uneven light intensity, must be changed for each reticle. A pattern that has no latitude is selected for the target pattern used herein, and corrected with the pattern.

Assume that the pupil asymmetry Podd of the degree of polarization varies for each image height and for each a, as shown in FIG. 10B. The degree of polarization's asymmetry inverts between the left end and the right end in the slit. As shown in FIG. 8C, the asymmetry of the degree of polarization causes the CD asymmetry with defocus, but this amount differs among points in the slit. Podd increases with σ: As the target pattern pitch becomes finer, the influence on the CD lateral difference increases in the degree of polarization distribution shown in FIG. 10B.

The degree of polarization depends upon a glass material's birefringence amount, a coating characteristic, an optical path, and an incident angle. It is thus difficult to adjust a degree of polarization difference among image heights. The characteristic of the pattern pitch differs according to reticles, and the influence on the lateral CD difference differs.

On the other hand, an asymmetrical light intensity distribution in the pupil behaves as shown in FIG. 8E, and the in-pupil asymmetry of the degree of polarization can be corrected when the asymmetry of the light intensity distribution in the pupil is adjusted for each image height. More specifically, the condenser lens 125 has a zooming mechanism for correcting the off-axis telecentricity. Therefore, while the incident principal ray of the center of the variable stop 128b maintains, and the incident principal ray can be inclined at the slit end. Due to this zooming, the telecentricity is maintained constant on the optical axis and to simply increase or decrease as a distance from the optical axis increases. The lateral CD difference caused by the degree of polarization distribution on the pupil plane can be corrected by adjusting the off-axis telecentricity corresponding to the reticle pattern that affects the yield.

Thus, this embodiment can correct the CD difference among image heights caused by the polarization property difference among image heights, and improve the yield. Of course, instead of the photodetector 210, the photodetector 452b may be used for measurements. While this embodiment divides σ into annular shapes and introduces the concepts of Peven and Podd for simplicity purposes, the degree of polarization of the effective light source may be expressed by the Zernike series or the like.

Third Embodiment

This embodiment is different from the first embodiment in that this embodiment gets the polarization information both near the reticle plane and near the plate plane. Two pieces of polarization information are expressed as follows, where $J_{1ol}$ and $J_{2ol}$ are polarization information near the wafer plane, $J_{1il}$ and $J_{2il}$ are polarization information near the reticle plane, and $UL(u_{ol}, v_{ol})$ is a polarization information component of a projection optical system:

$$\begin{pmatrix} J_{1ol}(u_{ol}, v_{ol})e^{i\varphi_{1ol}(u_{ol}, v_{ol})} \\ J_{2ol}(u_{ol}, v_{ol})e^{i\varphi_{2ol}(u_{ol}, v_{ol})} \end{pmatrix} = \quad \text{[EQUATION 6]}$$

$$UL(u_{ol}, v_{ol}) \begin{pmatrix} J_{1il}(u_{il}, v_{il})e^{i\varphi_{1il}(u_{il}, v_{il})} \\ J_{2il}(u_{il}, v_{il})e^{i\varphi_{2il}(u_{il}, v_{il})} \end{pmatrix}$$

Equation 7 is met when the term relating to UL in Equation 6 is developed, where $e^{i\Phi(u,v)}$ is a conventional aberration term, and T(u, v) is a conventional pupil amplitude transmittance.

$$UL(u, v) = \begin{pmatrix} J_{11}(u, v)e^{i\varphi_{11}(u,v)} & J_{12}(u, v)e^{i\varphi_{12}(u,v)} \\ J_{21}(u, v)e^{i\varphi_{21}(u,v)} & J_{22}(u, v)e^{i\varphi_{22}(u,v)} \end{pmatrix} \quad \text{[EQUATION 7]}$$

$$= e^{i\varphi(u,v)}T(u, v)\begin{pmatrix} J'_{11}(u, v) & J'_{12}(u, v) \\ e^{i\varphi_{11}(u,v)} & e^{i\varphi_{12}(u,v)} \\ J'_{21}(u, v) & J'_{22}(u, v) \\ e^{i\varphi_{21}(u,v)} & e^{i\varphi_{22}(u,v)} \end{pmatrix}$$

As shown in Equation 7, the pupil transmittance distribution and wavefront aberration have a conventional fixed component that does not depend upon the polarization, and a variable component that depends upon the polarization direction. When the polarization direction is switched in accordance with the reticle pattern, the pupil transmittance distribution and the wavefront aberration shift of the projection optical system 300 from the optimal positions.

The fixed component that does not depend upon the polarization can be corrected by inserting a filter having a two-dimensional transmittance distribution into a pupil plane in the projection optical system 300. In FIG. 1, the pupil plane in the projection optical system 300 is near the mirror 302 or at intersections of plural principal rays having different image heights between Gb and the plate 400.

Figure 6A:
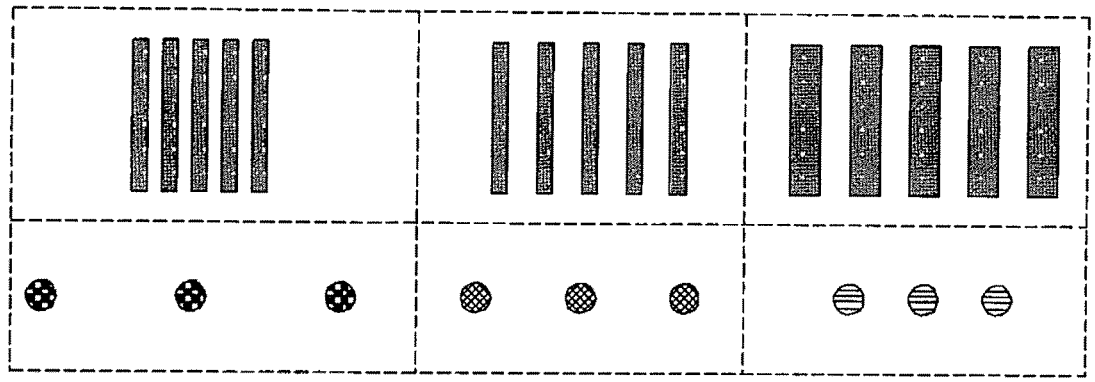
FIG. 6A schematically shows three types of patterns and 0th order lights and ±1st order diffracted lights generated from these patterns.
Figure 6B:
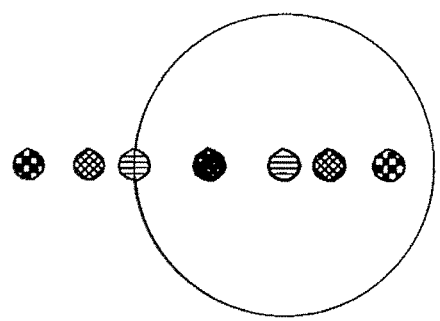
FIG. 6B schematically shows a pupil transmittance on an exit pupil of a projection optical system and positions of the diffracted lights from the reticle pattern that is illuminated by an obliquely incident light, when viewed from above a pupil plane.
Figure 6C:
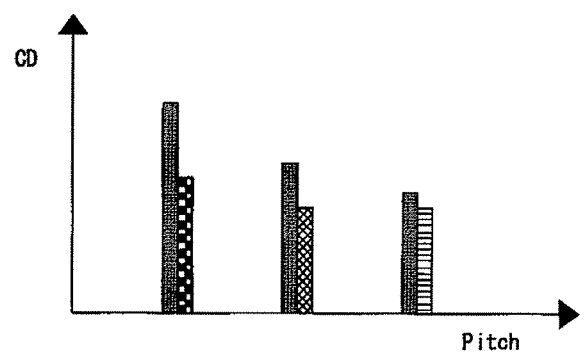
FIG. 6C is a graph in which an abscissa axis denotes a pattern pitch, and an ordinate axis denotes a CD when sliced with a predetermined light intensity.

On the other hand, the pupil transmittance distribution that depends upon the polarization can be corrected by changing a transmittance filter, inserting and removing filters having different transmittance distribution, and placing a proper distribution in place. However, other parameters can mitigate the imaging influence of the pupil transmittance instead of directly changing the transmittance itself. Referring now to FIGS. 6A-6C, a description will be given of the influence of the transmittance distribution of the pupil in the projection optical system 300 on the imaging characteristic.

FIG. 6B shows an average component although the transmittance distribution differs for each image height. On the other hand, assume exposure of a reticle with a pattern having three types of pitches, as shown in FIG. 6A. FIG. 6A shows the 0th order light and ±1st order diffracted lights from each pattern when the reticle is illuminated by an obliquely incident light. FIG. 6B schematically shows the pupil transmittance on the exit pupil in the projection optical system 300 and the diffracted light positions from the patterns viewed from above the pupil plane when the reticle is illuminated by the obliquely incident light. In FIG. 6B, assume that the transmittance around the pupil is low. Then, the diffracted light from the fine pitch pattern is located at the low transmittance part. For the same illumination part, the 0th order light passes the same pupil coordinate in all the patterns. In FIG. 6B, the 0th order light is the fourth light from the right, and its position shifts from the pupil center due to the obliquely incident illumination.

Among the diffracted lights from the roughest pitch pattern in FIG. 6B, the right diffracted light is closer to the center than the diffracted light from the fine pitch pattern, and passes a position having a high transmittance. The left diffracted light does not contribute to imaging of the fine pitch pattern, but the diffracted light from the rough pitch pattern partially enters the pupil plane, although it passes a position having a very low transmittance.

When the pupil transmittance changes, for example, where the transmittance is high at the center of the pupil plane and low at the periphery as shown in FIG. 6B, the intensity of an optical image that occurs as a result of interference between the diffracted lights relatively decreases, degrading a imaging characteristic or generating a CD difference. This is expanded to the patterns having different pitches. FIG. 6C is a graph where an abscissa axis denotes a pattern pitch, and an ordinate axis denotes a CD with a slice of a predetermined light intensity. As shown in FIG. 6A, the diffracted light position on the pupil plane changes for each pitch, and the transmittance distribution on the pupil plane is uneven. Therefore, the attenuation degree of the light intensity that contributes to pattern imaging differs for each pitch.

This embodiment discusses the diffracted light from the on-axis incident light, but the actual annular effective light source provides a two-dimensionally integrated diffracted light distribution for the diffracted lights of the annular effective light source. In the diffracted light distribution, only the inner part of the aperture pupil contributes to imaging in the projection optical system 300. In that case, when the pupil transmittance does not have a uniform distribution, the reticle pattern having a different pitch has a different light intensity that contributes to imaging. Thus, as shown in FIG. 6C, a CD difference between the ideally uniform pupil transmittance distribution and the actually uneven pupil transmittance distribution differs for each pattern pitch.

Figure 7:
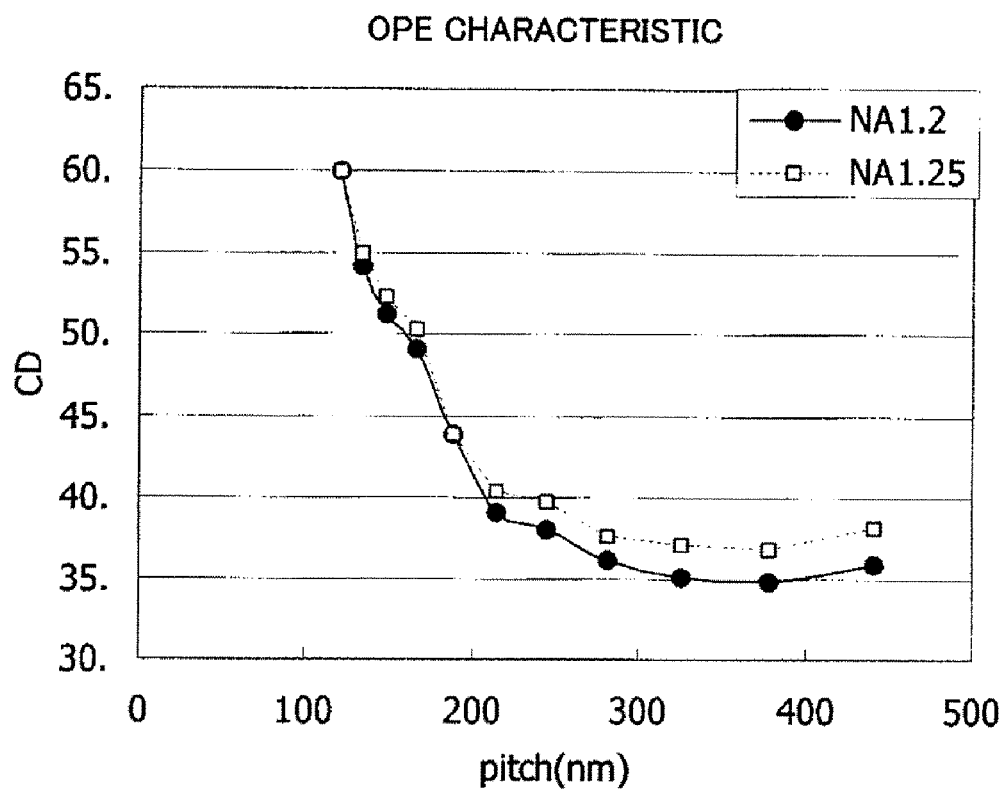
FIG. 7 is a graph showing a relationship between the pitch and the CD for different NAs.

While an optical proximity effect ("OPE") refers to a CD difference from the ideal value to a pitch, an offset from the ideal value is observed in various contrast-caused items, such as a wavelength center value, a spectral bandwidth, a pupil shape of the illumination optical system, a luminosity distribution, a degree of polarization, an in-pupil degree of polarization distribution, an NA of the projection optical system, and a spherical aberration. Therefore, the OPE characteristic that varies due to the pupil transmittance is correctable by a combination of these exposure parameters. A pattern's directional difference, such as X/Y, depends upon a pupil shape, a luminosity distribution, a polarization direction, and an in-pupil degree of polarization distribution of the illumination optical system, and an astigmatism of a projection optical system. FIG. 7 shows a relationship between the pitch and CD for different NAs. It is understood from FIG. 7 that a CD difference varies for a different NA and a different pitch. The influence of the degree of polarization and pupil transmittance can be mitigated by estimating the influence on the CD with respect to other items, and adjusting the above parameters so that the OPE characteristic has a desired value.

A pattern characteristic difference among image heights is adjustable by properly adjusting parameters, although its detailed description will be omitted. In particular, in setting a polarization direction in accordance with a reticle pattern and correcting the pupil transmittance that is generated in accordance with the polarization direction, the optimal value is likely to change for each reticle. Therefore, by selecting a quickly correcting parameter among the above parameters, the pupil transmittance can be adjusted with an exchange of the reticle without lowering the productivity. Of course, it is applicable to a correction of the fixedly shifting pupil transmittance distribution.

A description will now be given of an aberration correcting method shown in Equation 7. The projection optical system has not only a wavefront aberration that does not depend upon the polarization but also an aberration component that depends upon the polarization direction. In other words, the target value of the aberration changes in accordance with the optimization of the polarization direction that is performed every reticle.

Figure 13A:
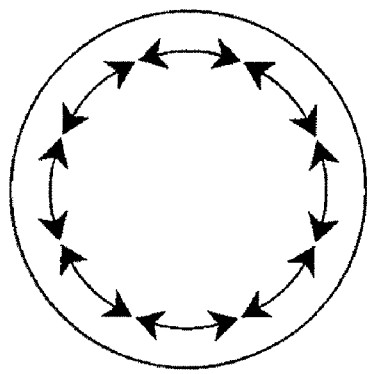
FIG. 13A is a schematic plane view showing an illustrative birefringence of the projection optical system in the exposure apparatus shown in FIG. 1.
Figure 13B:
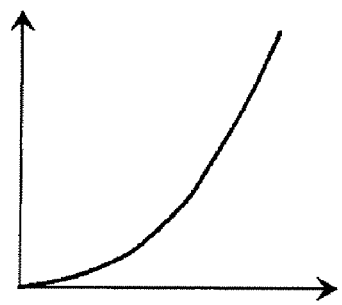
FIG. 13B is a graph showing that the birefringence amount shown in FIG. 13A increases like a quadratic function with a radius.
Figure 13C:
FIG. 13C shows a phase distribution on the pupil plane when the projection optical system shown in FIG. 13A receives the linearly polarization.
Figure 13C:
Figure 13C:
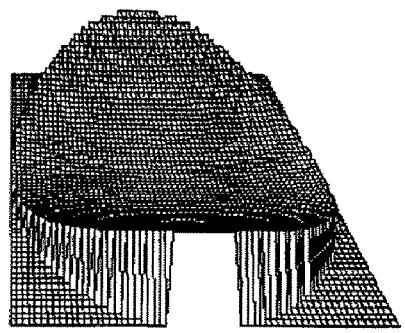
Figure 13D:
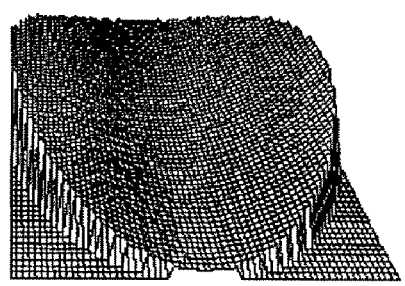
FIG. 13D shows a phase distribution on a pupil plane when the projection optical system shown in FIG. 13A receives another linearly polarization.

Assume that the exit pupil plane of the projection optical system 300 has a birefringence having a fast axis in a tangential direction as shown in FIG. 13A, and the birefringence amount increases with a radius like a quadratic function. One lens made of composite quartz can show such a characteristic. For an illumination with a linearly polarization, a phase distribution differs on the pupil plane in accordance with the polarization direction as shown in FIGS. 13C and 13D. The phase distribution on the pupil plane caused by polarization effect appear the same as the wavefront aberration of the projection optical system 300.

The projection optical system 300 has various wavefront-aberration adjusting mechanisms, and can adjust a spherical aberration, a coma, an astigmatism, a distortion etc. on site. A usual adjustment removes a fixedly aberrational component that does not depend upon the polarization, but the adjustment can correct the aberration that depends upon the polarization direction. An aberration adjusting mechanism can adjust, for example, an aberration of an axial symmetry that is uniformly added to all image heights, and other aberrations, such as an image plane, an astigmatism, a coma, a spherical aberration, and a distortion, which increases with a distance from the optical axis, by moving part of the lenses in the projection optical system in the optical-axis direction. The coma that is uniformly added to all image heights and the astigmatism that linearly varies for each image height, and the asymmetrical distortion can be adjusted by moving a lens in a direction perpendicular to the optical axis or inclining the lens in that direction.

The reticle 200 is provided with a pellicle that shields fine particles that cause pattern defects. The pellicle is made of a dielectric material, and the transmitting light intensity and phase change depending upon the incident angle. As an incident angle becomes very large with a high NA, the pupil transmittance distribution and in-pupil plane retardation become non-negligible. In addition, the pellicle film thickness difference among respective reticles and the pellicle's in-plane film thickness difference in the same reticle affect the pupil transmittance distribution and aberration among reticles and image heights. For example, the actual polarization information of the reference pellicle, which includes the polarization information of both projection optical system and the pellicle, can be obtained when a pellicle is adhered to a measurement pinhole reticle and the polarization information is directly obtained.

A measuring unit, such as an ellipsometer, measures, for each reticle, a film thickness of the pellicle adhered to the reticle that has a circuit pattern, and the pupil transmittance distribution and aberration can be calculated from a measurement value and pellicle's physical property value data. Using this information, the influence of the pellicle error on imaging can be corrected for each reticle. The film thickness may be controlled through an absolute value of the pellicle film or a film thickness difference from the reference pellicle adhered to the measurement pinhole reticle.

The ellipsometer may use an external measuring unit, or may use an in-situ measurement, for example, by introducing an obliquely incident light that has a variable polarization state from the bottom side of the reticle stage 250 to the pellicle plane and placing, in the exposure apparatus, an ellipsometer optical system that monitors the reflected light.

Fourth Embodiment

Figure 11A:
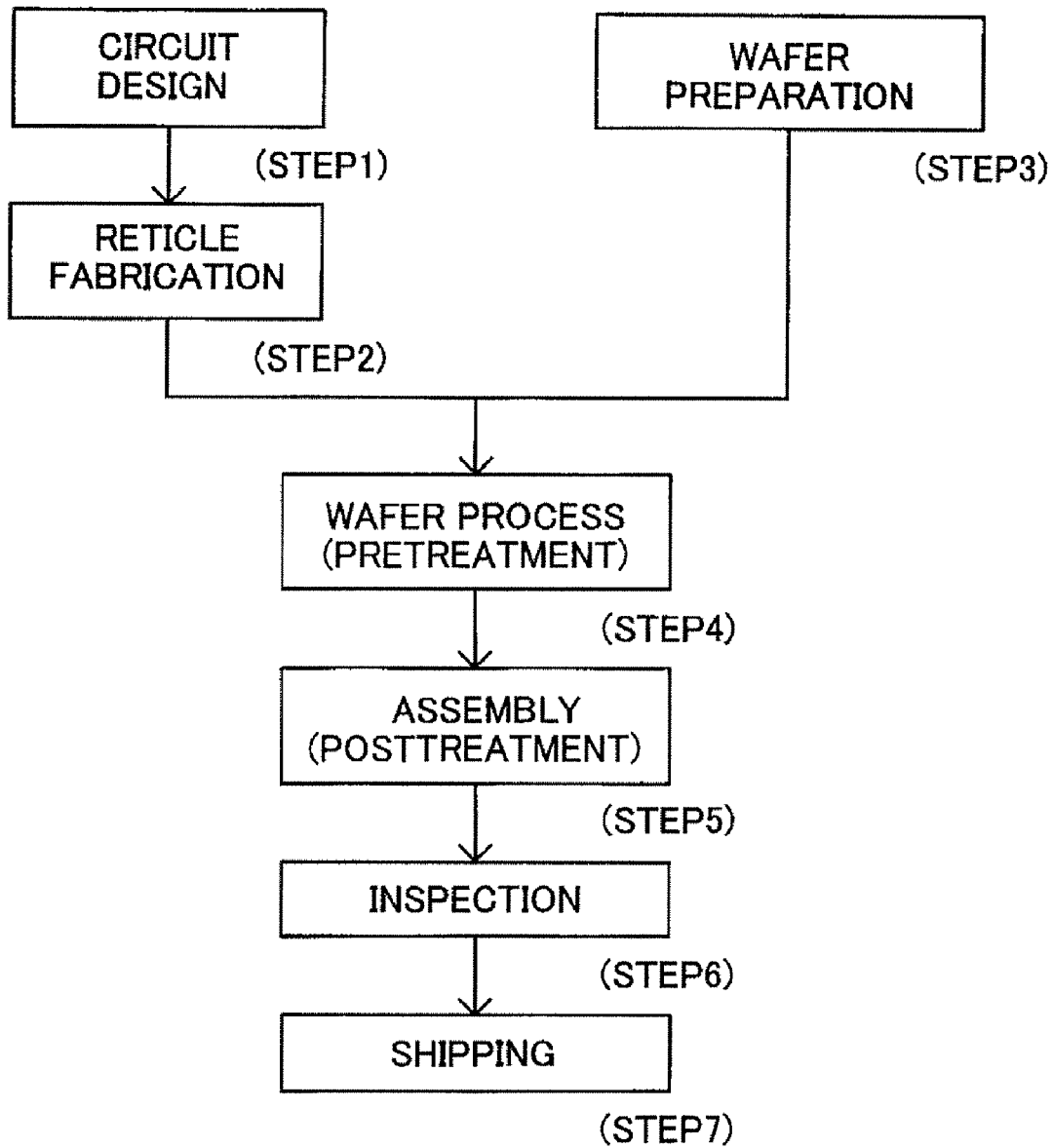
FIG. 11A is a flowchart for explaining a device manufacturing method using the exposure apparatus shown in FIG. 1.
Figure 11B:
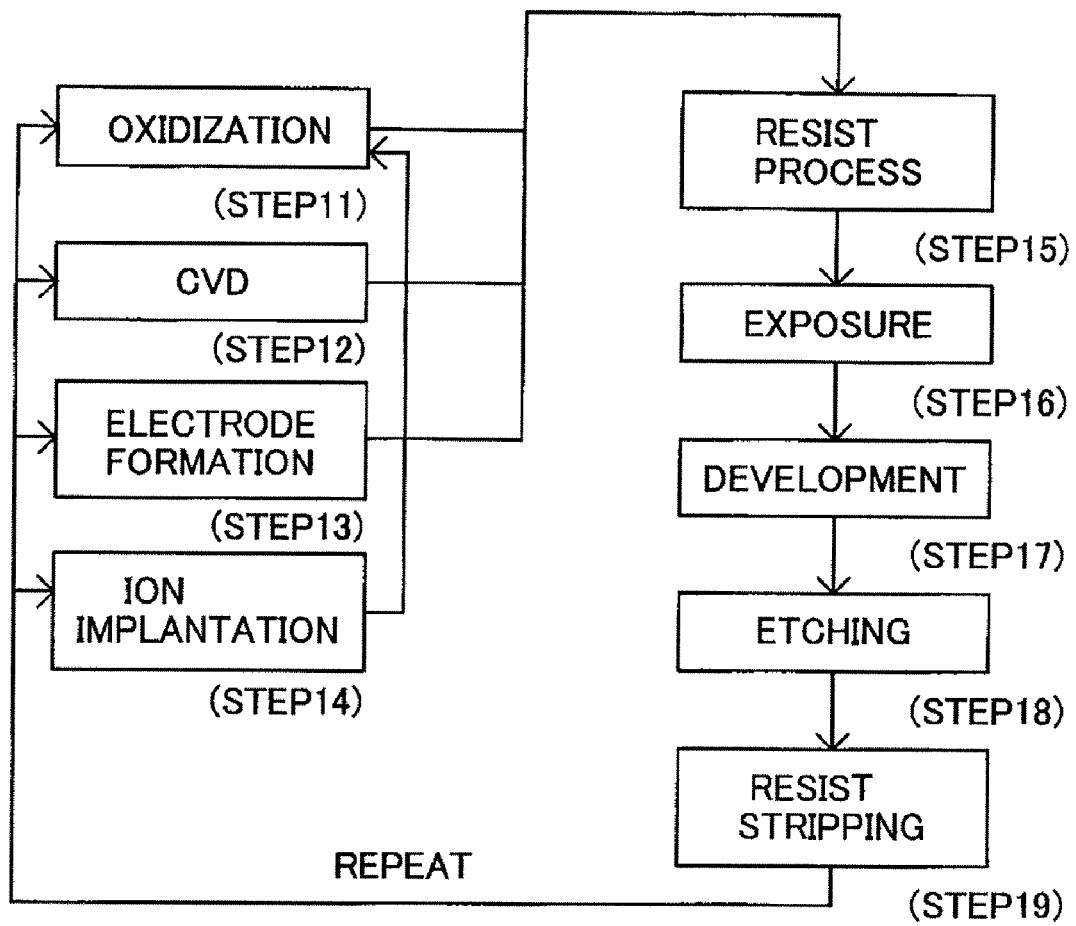
FIG. 11B is a flowchart of a step 4 shown in FIG. 11A.

Referring now to FIGS. 11A and 11B, a description will be given of an embodiment of a device manufacturing method using the above mentioned exposure apparatus 100. FIG. 11A is a flowchart for explaining how to manufacture semiconductor devices, such as ICs and LSIs, liquid crystal panels, and CCDs. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11B is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device fabrication method using the exposure apparatus 100, and resultant (intermediate and final) devices constitute one aspect of the present invention.

Fifth Embodiment

Figure 12A:
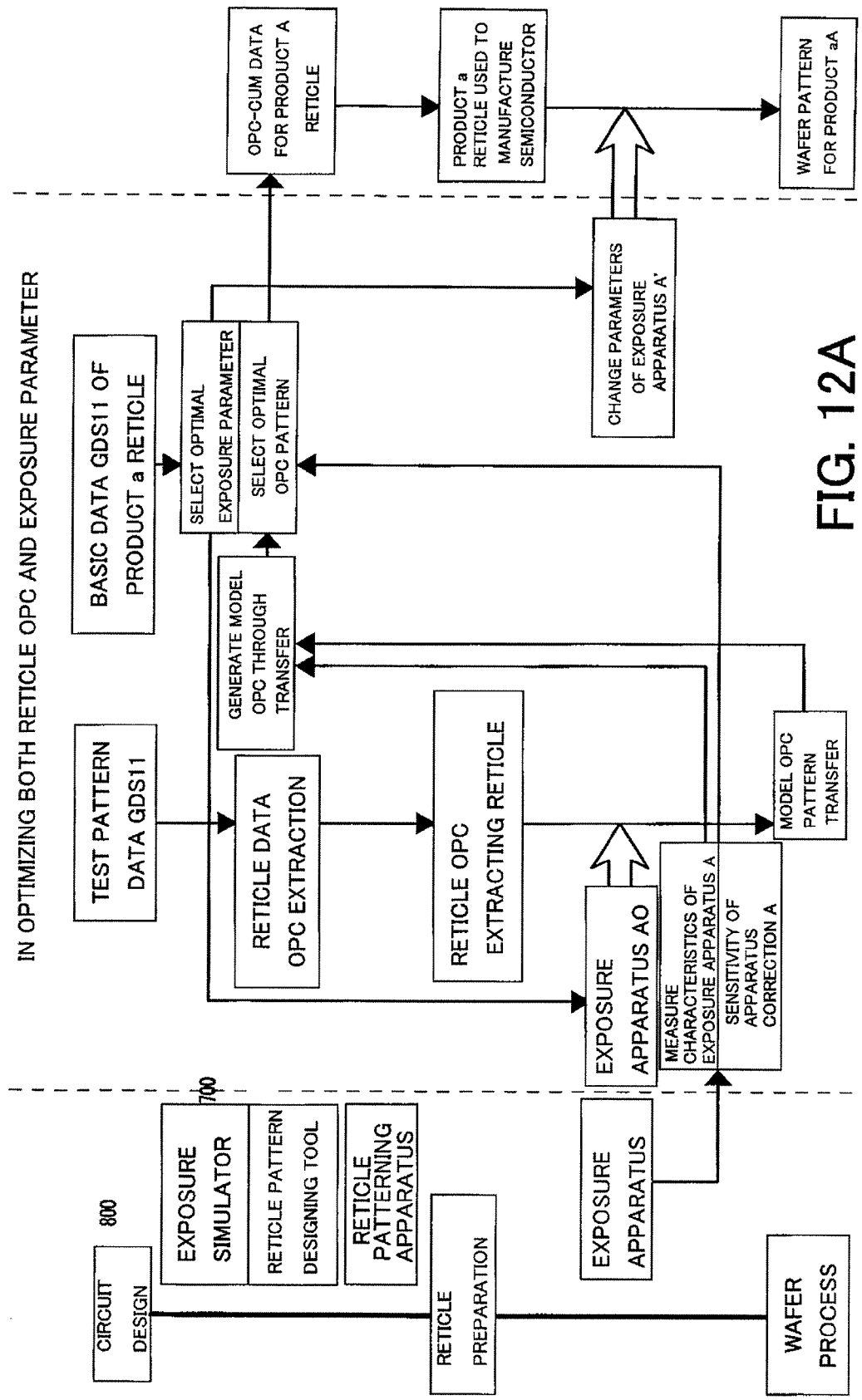
FIG. 12A is a block diagram for optimizing both the exposure condition and the reticle pattern.
Figure 12B:
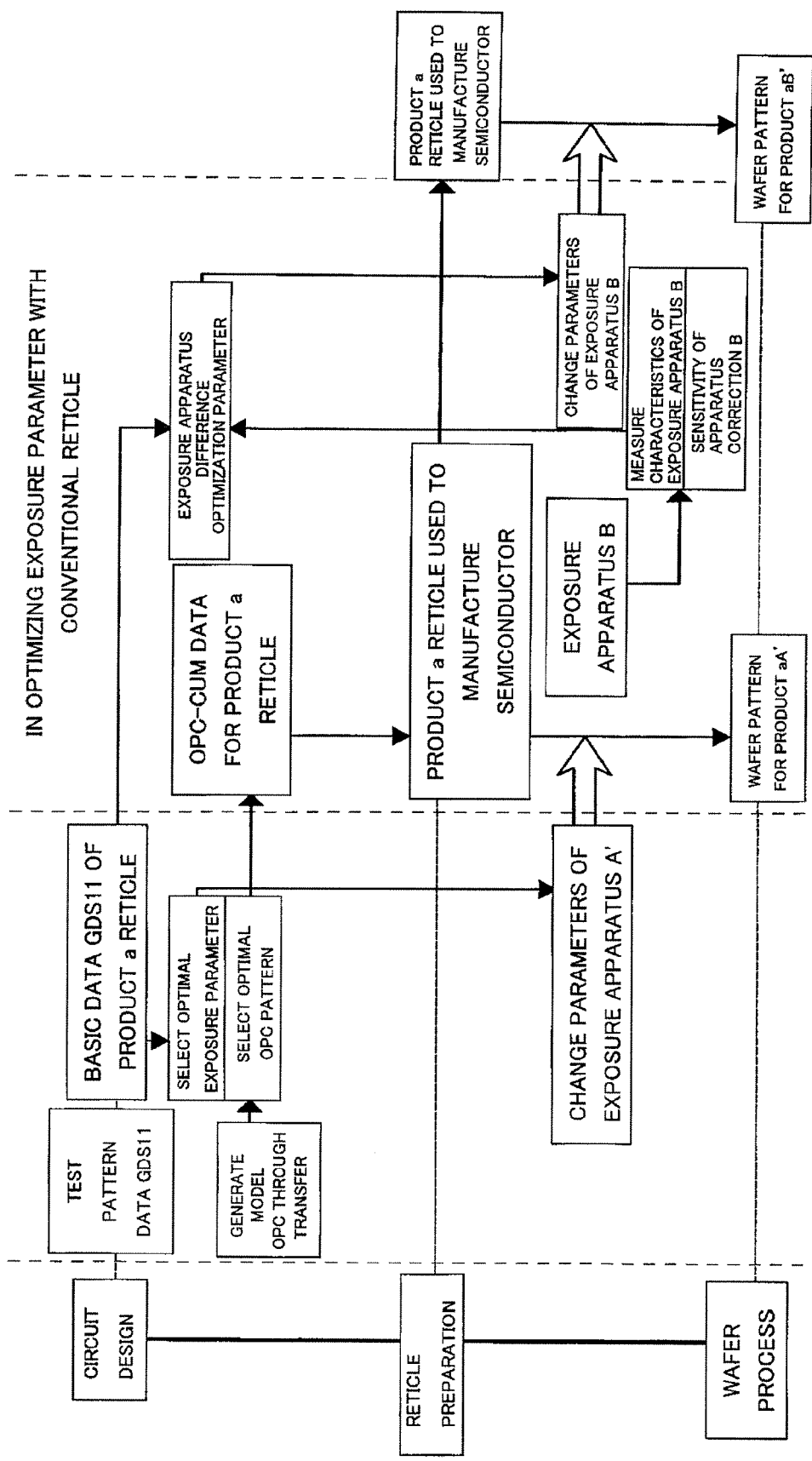
FIG. 12B is a block diagram for optimizing the exposure condition with a conventional reticle.

A description will now be given of optimizations of both a reticle pattern and an exposure condition by taking the polarization into account. This embodiment particularly relates to steps 1 to 4 shown in FIG. 1. FIG. 12A is a detailed block diagram of the optimizations of the exposure condition and reticle pattern.

A imaging simulator 700 takes pattern data to produce the reticle, such as GDSII and MDP, from a memory 800, generates part or entire shape of the pattern, and inputs it as object-side information for an imaging simulator. The imaging simulator calculates a light intensity distribution of an imaging point when the pattern of the object plane images via the projection optical system. The imaging simulator also calculates a resist pattern shape through various processes, such as an acid diffusion, post-baking, and development, using the light intensity distribution and the resist process parameter. In addition, the imaging simulator 700 uses a light intensity imaging simulator, a resist imaging simulator, a user's OPC rule and model to correct the resist pattern shape into a desired value through the OPC process to the known resist pattern.

One or more parameters that can be input into the imaging simulator 700 and separated from the polarization include a transfer wavelength, a spectral bandwidth, a light intensity distribution of an effective light source, a polarization distribution, size and shape, a projection optical system's NA, aberration amount, pupil's polarization light intensity distribution, and reduction ratio, a standard pellicle's aberrational amount, a pupil transmittance distribution, and a refractive index of a immersion liquid's refractive index between the projection optical system and the imaging plane. These items can be measured in the exposure apparatus or external measuring unit.

At least one computable evaluation index of the imaging pattern is an optical CD, an ED window, a depth of focus ("DOF"), NILS, a contrast, a resist CD, a side wall angle ("SWA"), and a transistor's electric characteristic.

There are three stages in patterning the reticle: The first stage acquires characteristics and correction sensitivity information of the exposure apparatus, and determines an exposure condition from the basic reticle pattern data. The second stage is to produce the OPC data of the reticle. After analyzing an exposure result of a reticle having an OPC extraction test pattern in the exposure apparatus in which the exposure condition is set in the first stage, and recognizing a difference from the imaging simulator results to the exposure one, an OPC model can be produced. The third stage integrates three of the exposure apparatus's characteristic and sensitivity, the basic reticle pattern data, and the model base OPC information, optimizes the exposure condition and the reticle pattern, and exposes the reticle with the exposure apparatus in which the optimal exposure conditions are set.

Many steps and a long time period are necessary to expose the reticle pattern onto the wafer. The optimization of the exposure condition is important to shorten the manufacturing time period and improve the yield. In order to improve the precision, the exposure apparatus's characteristic and corrective sensitivity are calculated and input into the imaging simulator 700.

This embodiment include the evaluation of an imaging characteristic of the model base OPC production pattern in addition to the polarization information of such optical system as an illumination optical system and a projection optical system. Therefore, the imaging simulator's output becomes accurate, and the model base OPC library having a high correction precision can be produced when the output is correlated with the resist image as a result of actual exposure of the model base OPC production pattern. More specifically, the improved imaging evaluation precision of the imaging simulator in inputting the reticle pattern would improve the optimization precision of the exposure condition and the reticle pattern. It is the OPC that takes the longest time period in producing the reticle. Since a reproduction of the reticle needs a very long time period, the improvement of the OPC's precision is important.

In the concrete optimization flow of the exposure apparatus parameters, an optimization initially starts to improve the characteristic to the entire slit. In order to investigate the influence on the imaging characteristic of the entire slit, this embodiment selects a critical reticle pattern, which is called a hot spot and directly affects the yield, and an evaluation method. Alternatively, a reference pattern to evaluate the imaging characteristic is prepared in advance and used.

An OPE characteristic is evaluated with at least two or more patterns. The imaging evaluation method may use, for example, a CD value, a contrast, an ED-window, and a NILS value at a predetermined location, and require these values to be within permissible ranges, or these values weighed among plural evaluation methods to be within permissible ranges. In particular, the OPE characteristic evaluates relative CD values among two or more evaluation criteria.

At least one of items is selected as a correction parameter, which includes an NA value, an effective light source shape, an effective light source luminosity distribution, an effective light source polarization direction and degree, a laser's spectral bandwidth, a spherical aberration, and an astigmatism. The correction parameter corrects an average component for each image height, and reduces a difference among image heights. The OPC amount is adjusted in optimizing the reticle pattern.

Next follows a correction of an asymmetrical imaging component in the entire slit, such as a lateral and longitudinal CD difference between two lines, which may exist in the reticle pattern or other standard pattern. The imaging evaluation method evaluates a pattern CD opposite to relative to the other CD as a reference, and corrects an asymmetry of a pupil transmittance distribution, an asymmetry of a luminosity distribution of an effective light source, an on-axis telecentricity, an astigmatism, a coma of entire plane, and a 3θ aberrational component on the entire plane.

Moreover, a difference of an imaging characteristic at each point in the slit, such as a center and both ends in the field, are corrected based on various regional differences, such as a CD value, a contrast, an ED-window, and a NILS value. More specifically, the pupil transmittance at each point, the image height difference of the degree of polarization, the image plane of the lens, and the light intensity distribution in the slit are corrected. A difference of the asymmetrical component at each point is corrected by an asymmetry of the luminosity distribution of the effective light source, the off-axis telecentricity, the off-axis coma, and the off-axis 3θ aberration component, etc.

Finally, an imaging characteristic difference among shots, wafers and lots are evaluated primarily based on the CD, and corrected based on a set value, such as an integral exposure dose. The optimized OPC pattern is superimposed onto the reticle reference data into a reticle as a production. Thus, a reticle having a high yield can be produced.

The optimization flow may change the order, and repeat a certain step. The optimization of the exposure condition may limit an optimization range to improve the efficiency. For example, for the light source 110, an index, such as Full-width half maximum ("FWHM") and E95 in changing the spectral bandwidth, and an equation that defines a relationship with the spectrum intensity distribution of the actual light source are preset. A relationship between the difference value and the correction amount is formulized. The shape and annulus ratio of the effective light source are read as bit map data, for example, when ⅔ annulus is set, and a difference from the brightness bit map is calculated when σ and annulus ratio is changed. A relationship between the difference value and the correction amount is formularized.

In exchanging a DOE for generating an effective light source shape, the luminosity distribution of the effective light source from a newly produced DOE can be predicted. In switching the DOE between the DOE and the reticle plane, the slope of the brightness of the effective light source edge part in the radial and tangential directions are measured in advance. The parameters include an incident angle of the light upon the DOE, an outer a, an inner a, an NA, and DOE shape information. When a relationship between the brightness slope and the parameter is previously formularized, the imaging simulator can optimize the exposure condition by taking into account an adjustment range of the effective light source luminosity distribution in the actual apparatus.

The polarization direction may be limitedly optimized, for example, in the X direction, the Y direction, the radial direction, and the tangential direction.

The aberration of the projection optical system may be optimized by limiting the driving adjustment range of a lens etc. using information of the inherent adjustment range for each projection optical system under condition that it is within a permissible range relative to the other aberration. The "adjustment range" means that a lens element unit is moved within ±50 μm, a decentering is within ±10 μm or within 0.01°. The "permissible range relative to the other aberration" means, for example, that the distortion is within 2 nm when the coma is optimized, and the image plane and astigmatism are within 5 nm.

In exposing, with a second exposure apparatus, a reticle optimized for a first exposure apparatus, the second exposure apparatus parameters are optimized to correct characteristic difference among these exposure apparatuses.

In order to simulate the imaging pattern in the second exposure apparatus, it is necessary to determine the initial value of the parameter of the second exposure apparatus. Initially, all measurable characteristics of the first exposure apparatus are measured. Then, each parameter is corrected so that each parameter approaches to the measured value of the first exposure apparatus by means of the corresponding correction sensitivity table of the second exposure apparatus and the measurement value of the second exposure apparatus. Regarding the unknown parameter of the first exposure apparatus, the current measurement value of the second exposure apparatus is input as it is into the imaging simulator.

All or part of the design data of the reticle is input as an initial state of object plane information into the imaging simulator, and the calculated imaging pattern is evaluated based on the initial data. The imaging simulator analyzes for each of the two orthogonal polarization directions, and adds the light intensity distribution on the imaging plane. The exposure apparatus parameters to be measured include, for example, a light source spectral bandwidth, NA, σ, pupil transmittance, degree of polarization, light intensity distribution in the slit, integral exposure dose distribution, on-axis telecentricity, off-axis telecentricity, lens's aberrations, pellicle's film thickness in the know reticle, etc.

The imaging characteristic of all parameters is calculated for each polarization, and part that affects the yield of the reticle pattern is evaluated, for example, by evaluation parameters. The evaluation includes a pattern at two or more points in one evaluation direction and a direction orthogonal to the one evaluation direction. Thus, the polarization influence is evaluated. A reference pattern for evaluating the imaging characteristic may be prepared in advance and used. The OPE characteristic is evaluated for at least two patterns, and the influence of the pattern direction is evaluated with an evaluation pattern in a different direction.

A host manages the characteristic and measurement data of the exposure apparatus, and the data relating to the changing rate at the time of correction per exposure apparatus, and uses them in optimizing the exposure condition of the second exposure apparatus with a known reticle by comparing the information about equipment characteristic of the first exposure apparatus with the information about equipment characteristic of the second exposure apparatus. The host may manage the pellicle's film thickness in the reticle, the pupil transmittance characteristic, the aberration characteristic etc. for use with the optimization parameters.

The host sends the optimized parameters to the second exposure apparatus, and the second exposure apparatus automatically sets in the Job parameters.

As discussed above, the present invention can optimize the exposure condition and reticle pattern, and remarkably improve the yield even when an optical system has such a high NA that the polarization's influence on the imaging characteristic is non-negligible.

Further, the present invention is not limited to these preferred embodiments, and various variations and modifications may be made without departing from the scope of the present invention.

This application claims a foreign priority based on Japanese Patent Application No. 2005-212254, filed on Jul. 22, 2005, and which is hereby incorporated by reference herein.

What is claimed is:

1. An exposure apparatus configured to expose a pattern of a reticle onto a plate using a light from a light source, said exposure apparatus comprising:
   an optical system configured to introduce the light;
   a measuring part configured to measure an offset between a polarization state of the light that has passed the optical system and a reference polarization state, the polarization state including at least one of polarized light intensities, a ratio between the polarized light intensities, a degree of polarization, or a retardation of two orthogonal directions that are both perpendicular to the optical axis; and
   a controller configured to control, based on the offset of the polarization state measured by said measuring part, at least one exposure parameter of the light source or the optical system without controlling respective polarization of the light source or the optical system.

2. An exposure apparatus according to claim 1, wherein said controller controls the exposure parameter based on change information of the pattern when a size or shape of the pattern partially changes so as to enable another exposure apparatus to resolve the pattern of the reticle.

3. An exposure apparatus according to claim 1, wherein:
   the optical system comprises an illumination optical system configured to illuminate the reticle and a projection optical system configured to project the pattern onto the plate, and
   the at least one exposure parameter is at least one of a spectra bandwidth of the light, an effective light source shape, a luminosity distribution of the effective light source, an inclination of the light emitted from the illumination optical system, a numerical aperture of the projection optical system, a pupil transmittance distribution of the projection optical system, or an aberration of the projection optical system.

4. A setting method configured to set an exposure parameter used to expose a pattern of a reticle onto a plate using an optical system and light from a light source, said setting method comprising the steps of:
   obtaining an offset between a polarization state of the light that has passed the optical system and a reference polarization state, the polarization state including at least one of polarized light intensities, a ratio between the polarized light intensities, a degree of polarization, or a retardation of two orthogonal directions that are both perpendicular to the optical axis; and
   setting, based on the obtained offset between the polarization state and the reference polarization state, at least one exposure parameter of the light source or the optical system without controlling respective polarization of the light source or the optical system.

5. A setting method according to claim 4, wherein:
   the optical system includes an illumination optical system configured to illuminate the reticle and a projection optical system configured to project the pattern onto the plate, and
   the at least one light exposure parameter includes at least one of a spectral bandwidth of the light, an effective light source shape, a luminosity distribution of the effective light source, an inclination of the light emitted from the illumination optical system, a numerical aperture of the projection optical system, a pupil transmittance distribution of the projection optical system, or an aberration of the projection optical system.

6. A setting method according to claim 4, wherein:
   the optical system includes an illumination optical system configured to illuminate the reticle, and
   said setting step includes the step of changing at least one of an integrated exposure dose or an inclination of the light emitted from the illumination optical system for each image height, when a difference in an image height of an actual degree of polarization is not within a permissible range.

7. A setting method according to claim 4, wherein:
   the optical system includes a projection optical system configured to project the pattern onto the plate, and
   said setting step includes the step of changing at least one of exposure parameters including an aberration or pupil transmittance of the projection optical system, when at least one of the birefringence or pupil transmittance of the projection optical system are not within a permissible range.

8. A setting method according to claim 4, wherein said obtaining step includes the steps of:
   obtaining physical property information including information relating to an illumination distribution, an aberration distribution, a polarization distribution, or a pupil transmittance distribution of the optical system; and
   obtaining information of the pattern of the reticle,
   wherein said exposure method further comprises the step of executing a simulation of an image quality of the pattern based on the physical property information and the information of the pattern, and
   wherein said setting step sets, based on a result of the simulation, at least one of exposure parameters including the light source or the optical system, or a size or shape of the pattern.

9. An exposure method configured to expose a pattern of a reticle onto a plate using a light from a light source, an exposure method comprising the steps of:
   setting the exposure parameter using a setting method according to claim 4; and
   exposing the pattern of the reticle onto the plate using the exposure parameter that has been set.

10. A device manufacturing method comprising the steps of:
    exposing a plate using an exposure method according to claim 9;
    developing the plate that has been exposed; and
    forming a device from the plate that has been developed.

11. A non-transitory computer-readable recording medium that records a program configured to enable a computer to set an exposure parameter used to expose a pattern of a reticle onto a plate using an optical system and a light from a light source, said program comprising the steps of:
    obtaining an offset between a polarization state of the light that has passed the optical system and a reference polarization state, the polarization state including at least one of polarized light intensities, a ratio between the polarized light intensities, a degree of polarization of each polarized light, or a retardation of two orthogonal directions that are both perpendicular to the optical axis; and
    setting, based on the obtained offset between the polarization state and the reference polarization state, at least one exposure parameter of the light source or the optical system without controlling respective polarization of the light source or the optical system.

12. A setting method according to claim 4, further comprising the steps of:

obtaining an average degree of polarization in an exposure slit as the polarization state; and setting the exposure parameter based on the average degree of polarization in the exposure slit.

13. A setting method according to claim 4, further comprising the steps of:

obtaining an image height distribution in an exposure slit of the polarization state; and setting the exposure parameter based on the image height distribution in the exposure slit.

* * * * *